(12) United States Patent
Sun et al.

(10) Patent No.: US 11,910,599 B2
(45) Date of Patent: Feb. 20, 2024

(54) CONTACT STRUCTURES FOR THREE-DIMENSIONAL MEMORY DEVICE

(71) Applicant: Yangtze Memory Technologies Co., Ltd., Hubei (CN)

(72) Inventors: Zhongwang Sun, Hubei (CN); Guangji Li, Hubei (CN); Kun Zhang, Hubei (CN); Ming Hu, Hubei (CN); Jiwei Cheng, Hubei (CN); Shijin Luo, Hubei (CN); Kun Bao, Hubei (CN); Zhiliang Xia, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 17/993,600

(22) Filed: Nov. 23, 2022

(65) Prior Publication Data
US 2023/0086425 A1    Mar. 23, 2023

Related U.S. Application Data

(60) Continuation of application No. 17/313,740, filed on May 6, 2021, now Pat. No. 11,552,091, which is a
(Continued)

(51) Int. Cl.
*H10B 41/27* (2023.01)
*H10B 41/35* (2023.01)
(Continued)

(52) U.S. Cl.
CPC .............. *H10B 41/27* (2023.02); *H10B 41/35* (2023.02); *H10B 41/41* (2023.02); *H10B 43/27* (2023.02); *H10B 43/35* (2023.02); *H10B 43/40* (2023.02)

(58) Field of Classification Search
CPC ........ H10B 43/27; H10B 43/50; H10B 43/35; H10B 41/27; H10B 41/50; H10B 43/20
See application file for complete search history.

(56) References Cited

U.S. PATENT DOCUMENTS 10,276,583 B2    4/2019   Sharangpani et al.
2012/0070944 A1  3/2012   Kim et al.
(Continued)

FOREIGN PATENT DOCUMENTS

CN    105047668 A    11/2015
CN    105845687 A    8/2016
(Continued)

OTHER PUBLICATIONS

International Search Report and Written Opinion of the International Searching Authority directed to related International Patent Application No. PCT/CN2018/120715, dated Sep. 11, 2019; 8 pages.

*Primary Examiner* — Xiaoming Liu
(74) *Attorney, Agent, or Firm* — Sterne, Kessler, Goldstein & Fox P.L.L.C.

(57) ABSTRACT

Embodiments of contact structures of a three-dimensional memory device and fabrication method thereof are disclosed. The three-dimensional memory structure includes a film stack disposed on a substrate, wherein the film stack includes a plurality of conductive and dielectric layer pairs, each conductive and dielectric layer pair having a conductive layer and a first dielectric layer. The three-dimensional memory structure also includes a staircase structure formed in the film stack, wherein the staircase structure includes a plurality of steps, each staircase step having two or more conductive and dielectric layer pairs. The three-dimensional memory structure further includes a plurality of coaxial contact structures formed in a first insulating layer over the staircase structure, wherein each coaxial contact structure
(Continued)

includes one or more conductive and insulating ring pairs and a conductive core, each conductive and insulating ring pair having a conductive ring and an insulating ring.

14 Claims, 18 Drawing Sheets

Related U.S. Application Data division of application No. 16/240,151, filed on Jan. 4, 2019, now abandoned, which is a continuation of application No. PCT/CN2018/120715, filed on Dec. 12, 2018.

(51) Int. Cl.
   *H10B 43/27*   (2023.01)
   *H10B 41/41*   (2023.01)
   *H10B 43/35*   (2023.01)
   *H10B 43/40*   (2023.01)

(56) References Cited

U.S. PATENT DOCUMENTS

| | | |
|---|---|---|
| 2012/0306090 A1 | 12/2012 | Smith et al. |
| 2014/0197546 A1* | 7/2014 | Hwang .................. H10B 43/27 257/774 |
| 2015/0028470 A1* | 1/2015 | Gallegos ........... H01L 21/76898 257/737 |
| 2015/0137216 A1 | 5/2015 | Lee et al. |
| 2015/0318301 A1 | 11/2015 | Lee et al. |
| 2015/0319860 A1* | 11/2015 | Corisis .................. H05K 1/115 174/266 |
| 2016/0225785 A1 | 8/2016 | Kim et al. |
| 2017/0179025 A1 | 6/2017 | Yun et al. |
| 2017/0278859 A1* | 9/2017 | Sharangpani ....... H01L 21/0217 |
| 2017/0294384 A1* | 10/2017 | Chen ...................... H10B 43/27 |
| 2018/0226341 A1 | 8/2018 | Yazawa |
| 2018/0294225 A1 | 10/2018 | Lee et al. |
| 2020/0194447 A1 | 6/2020 | Sun et al. |
| 2021/0265375 A1 | 8/2021 | Sun et al. |

FOREIGN PATENT DOCUMENTS

| | | |
|---|---|---|
| CN | 106847820 A | 6/2017 |
| CN | 107680972 A | 2/2018 |
| CN | 108028256 A | 5/2018 |
| CN | 108493192 A | 9/2018 |
| CN | 108695336 A | 10/2018 |
| CN | 108899322 A | 11/2018 |
| CN | 108899324 A | 11/2018 |
| TW | 201814883 A | 4/2018 |
| TW | 201824513 A | 7/2018 |
| WO | WO 2018031094 A1 | 2/2018 |

* cited by examiner

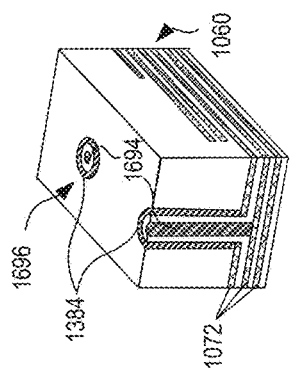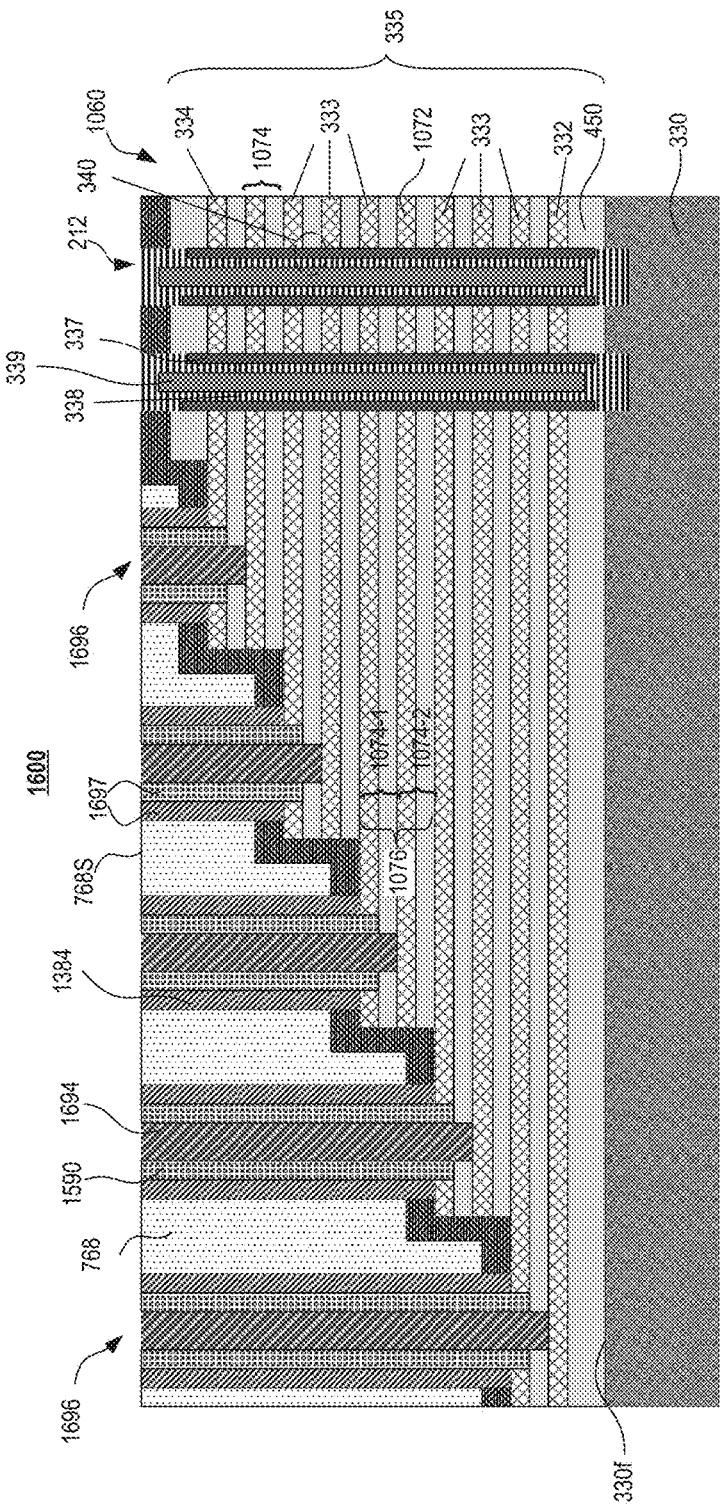

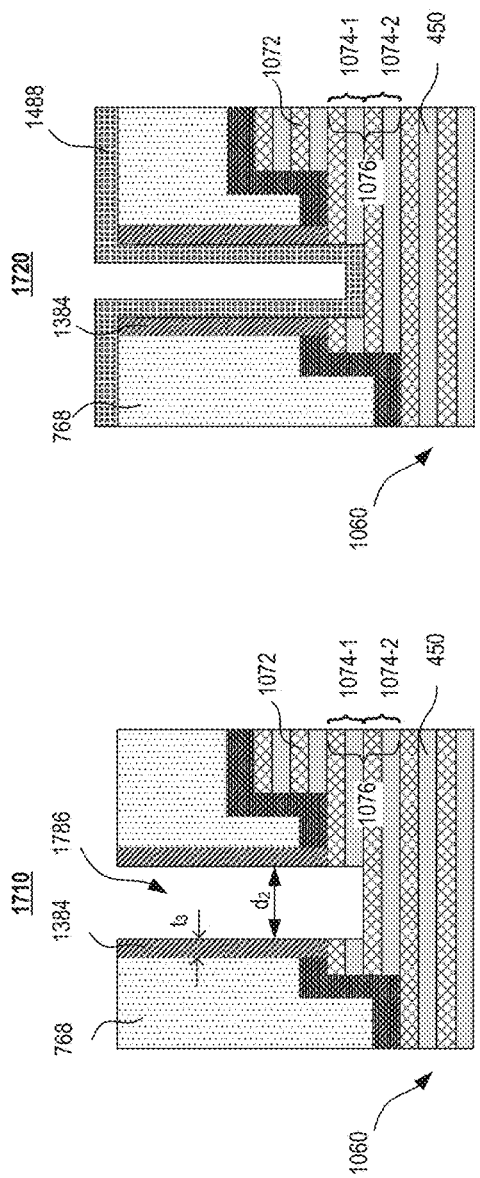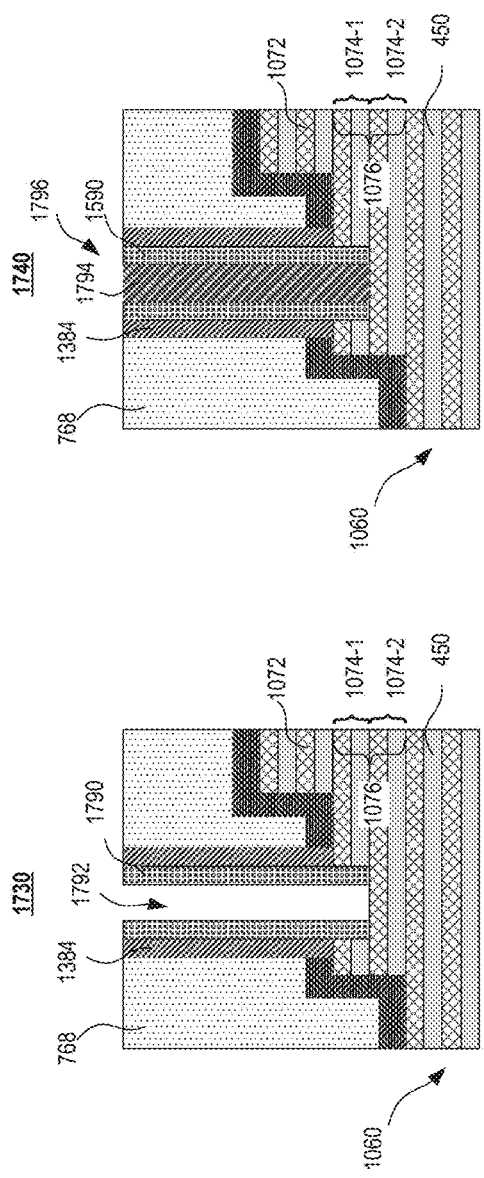

CONTACT STRUCTURES FOR THREE-DIMENSIONAL MEMORY DEVICE

INCORPORATION BY REFERENCE

This application is a continuation of U.S. patent application Ser. No. 17/313,740 filed on May 6, 2021 and titled "Contact Structures for Three-Dimensional Memory Device," now U.S. Pat. No. 11,552,091 issued on Jan. 10, 2023, which is a divisional of U.S. patent application Ser. No. 16/240,151 filed on Jan. 4, 2019 and titled "Contact Structures for Three-Dimensional Memory Device," which claims priority to PCT/CN2018/120715 filed on Dec. 12, 2018, all of which are incorporated herein by reference in their entirety.

TECHNICAL FIELD

The present disclosure generally relates to the field of semiconductor technology, and more particularly, to a method for forming a three-dimensional (3D) memory.

BACKGROUND

Planar memory cells are scaled to smaller sizes by improving process technology, circuit designs, programming algorithms, and the fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

BRIEF SUMMARY

Embodiments of contact structures for a three-dimensional memory device and methods for forming the same are described in the present disclosure.

In some embodiments, a three-dimensional memory structure includes a film stack disposed on a substrate, wherein the film stack includes a plurality of conductive and dielectric layer pairs, each conductive and dielectric layer pair having a conductive layer and a first dielectric layer. The three-dimensional memory structure also includes a staircase structure formed in the film stack, wherein the staircase structure includes a plurality of steps, each staircase step having two or more conductive and dielectric layer pairs. The three-dimensional memory structure further includes a plurality of coaxial contact structures formed in a first insulating layer over the staircase structure, wherein each coaxial contact structure includes one or more conductive and insulating ring pairs and a conductive core, wherein each conductive and insulating ring pair includes a conductive ring and an insulating ring.

In some embodiments, each conductive ring contacts the conductive layer of a corresponding conductive and dielectric layer pair of the staircase step.

In some embodiments, each coaxial contact structure comprises at least an outer conductive ring and an inner conductive ring, and the outer conductive ring corresponds with an upper conductive and dielectric layer pair of the staircase step, wherein the outer conductive ring includes larger diameter, and the upper conductive and dielectric layer pair is farther away from the substrate.

In some embodiments, each coaxial contact structure comprises at least an outer conductive ring and an inner conductive ring, and the inner conductive ring corresponds with a lower conductive and dielectric layer pair of the staircase step, wherein the inner conductive ring includes smaller diameter, and the lower conductive and dielectric layer pair is closer to the substrate.

In some embodiments, the conductive core contacts the conductive layer closest to the substrate in the staircase step of two or more conductive and dielectric layer pairs.

In some embodiments, the insulating ring of the conductive and insulating ring pair is disposed to surround a sidewall of the conductive ring and a sidewall of the conductive layer of the staircase structure, wherein the insulating ring is configured to electrically isolate the conductive ring from another conductive ring or the conductive core.

In some embodiments, the insulating ring is disposed on a sidewall of the first dielectric layer of the staircase step of two or more conductive and dielectric layer pairs.

In some embodiments, the three-dimensional memory structure further includes a barrier layer, disposed between the first insulating layer and the staircase structure, and the plurality of coaxial contact structures extending through the barrier layer.

In some embodiments, the three-dimensional memory structure further includes a gate dielectric layer on the conductive layer, and the conductive rings extending through the gate dielectric layer to contact the conductive layers of the staircase structure.

Another aspect of the present disclosure provides a method for forming a three-dimensional (3D) memory device. A method for forming a three-dimensional (3D) memory structure includes disposing a dielectric film stack on a substrate, wherein the dielectric film stack includes a plurality of alternating dielectric layer pairs, each alternating dielectric layer pair having a first dielectric layer and a second dielectric layer different from the first dielectric layer. The method also includes forming a dielectric staircase in the dielectric film stack, wherein the dielectric staircase includes a plurality of steps, each dielectric staircase step having two or more alternating dielectric layer pairs. The method further includes disposing a first insulating layer on the dielectric staircase, forming a plurality of memory strings in the dielectric film stack, and replacing the second dielectric layers with conductive layers to form a staircase structure with a plurality of steps, wherein each staircase step includes two or more conductive and dielectric layer pairs, each conductive and dielectric layer pair having a conductive layer and the first dielectric layer. The method also includes forming a plurality of coaxial contact structures on the staircase structure.

In some embodiments, forming the coaxial contact structure includes forming a conductive and insulating ring pair for each conductive and dielectric layer pair of the staircase step in the staircase structure.

In some embodiments, forming the conductive ring includes forming a first contact hole to expose the conductive layer in one of the two or more conductive and dielectric layer pairs of the staircase step in the staircase structure, disposing a conductive film on a sidewall of the contact hole and the exposed conductive layer, and removing the conducive film and a portion of the conductive layer from the bottom of the first contact hole to form a conductive ring, wherein a bottom of the conductive ring is formed to contact the conductive layer in one of the two or more conductive and dielectric layer pairs of the staircase step in the staircase structure.

In some embodiments, forming the conductive ring further includes etching the dielectric layer of the next conductive and dielectric layer pair.

In some embodiments, forming the insulating ring includes disposing a second insulating layer in a first contact hole, and removing the second insulating layer from the bottom of the first contact hole. Forming the insulating ring also includes forming the insulating ring surrounding a sidewall of the conductive ring and a sidewall of the conductive layer of one of the two or more conductive and dielectric layer pairs in the staircase step in the staircase structure, and forming a second contact hole to expose the next conductive layer in the staircase step.

In some embodiments, forming the coaxial contact structure further includes forming a contact hole to expose the conductive layer closest to the substrate in the staircase step of two or more conductive and dielectric layer pairs, disposing a conductive material to fill the contact hole, and forming a conductive core to contact the conductive layer closest to the substrate in staircase step of two or more conductive and dielectric layer pairs.

In some embodiments, the method further includes performing a planarization process to remove the conductive material outside the contact hole and form a coplanar surface.

In some embodiments, the method further includes disposing a barrier layer on the dielectric staircase prior to the first insulating layer.

In some embodiments, forming the plurality of dielectric staircase steps includes disposing a patterning mask on the dielectric film stack, and etching exposed portions of the dielectric film stack in a direction perpendicular to a main surface of the substrate until portions of the two or more dielectric layer pairs are removed. Forming the plurality of dielectric staircase steps also includes trimming the patterning mask laterally, in a direction parallel to the main surface of the substrate, repeating the etching and the trimming processes until a dielectric staircase step closest to the main surface of the substrate is formed, and removing the patterning mask.

In some embodiments, replacing the second dielectric layers with the conductive layers to form the staircase structure, includes forming one or more slit structure openings, extending horizontally along the dielectric staircase, wherein the slit structure openings penetrate vertically through the dielectric film stack. Replacing the second dielectric layers also includes removing the second dielectric layers of the dielectric staircase to form a plurality of horizontal tunnels, and disposing the conductive layers inside the plurality of horizontal tunnels.

In some embodiments, the method further includes disposing a gate dielectric layer on sidewalls of the horizontal tunnels prior to disposing the conductive layer, wherein the gate dielectric layer includes high-k dielectric material, silicon oxide, silicon nitride or silicon oxynitride.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 16A illustrates a schematic cross-sectional view of an exemplary 3D memory structure at a certain fabricating stage, according to some embodiments of the present disclosure.

FIG. 16B illustrates a perspective view of a portion of an exemplary 3D memory structure at a certain fabricating stage, according to some embodiments of the present disclosure.

FIG. 17A-17D illustrate schematic cross-sectional views of an exemplary 3D memory structure at certain fabricating stages, according to some embodiments of the present disclosure.

Figure 1:
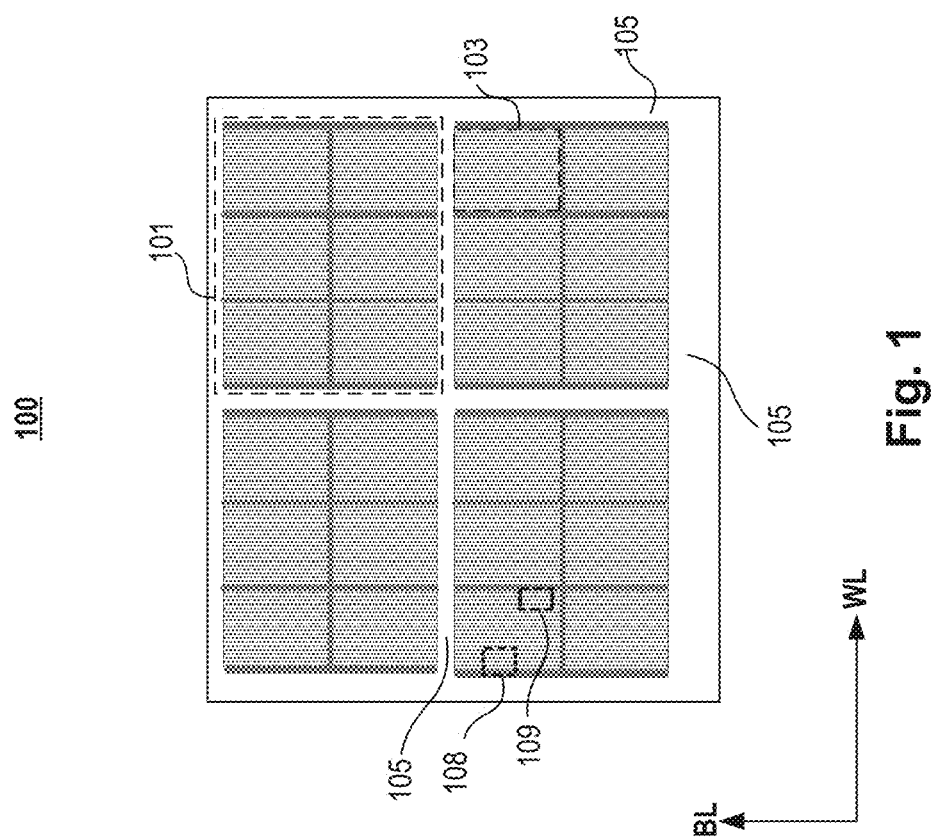
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a top surface and a bottom surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate. In the present disclosure, the term "each" may not only necessarily mean "each of all," but can also mean "each of a subset."

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

In some embodiments, a memory string of a 3D memory device includes a semiconductor pillar (e.g., silicon channel) that extends vertically through a plurality of conductive and dielectric layer pairs. The plurality of conductive and dielectric layer pairs are also referred to herein as an "alternating conductive and dielectric stack." An intersection of the conductive layer and the semiconductor pillar can form a memory cell. The conductive layer of the alternating conductive and dielectric stack can be connected to a word line at the back-end-of-line, wherein the word line can electrically connect to one or more control gates. For illustrative purposes, word lines and control gates are used interchangeably to describe the present disclosure. The top of the semiconductor pillar (e.g., transistor drain region) can be connected to a bit line (electrically connecting one or more semiconductor pillars). Word lines and bit lines are typically laid perpendicular to each other (e.g., in rows and columns, respectively), forming an "array" of the memory, also called a memory "block" or an "array block".

A memory "die" may have one or more memory "planes", and each memory plane may have a plurality of memory blocks. An array block can also be divided into a plurality of memory "pages", wherein each memory page may have a plurality of memory strings. In a flash NAND memory device, erase operation can be performed for every memory block and read/write operation can be performed for every memory page. The array blocks are the core area in a memory device, performing storage functions. To achieve higher storage density, the number of vertical 3D memory stacks is increased greatly, adding complexity and cost in manufacturing.

A memory die has another region, called the periphery, which provides supporting functions to the core. The periphery region includes many digital, analog, and/or mixed-signal circuits, for example, row and column decoders, drivers, page buffers, sense amplifiers, timing and controls, and the like circuitry. Peripheral circuits use active and/or passive semiconductor devices, such as transistors, diodes, capacitors, resistors, etc., as would be apparent to a person of ordinary skill in the art.

Other parts of the memory devices are not discussed for ease of description. In the present disclosure, a "memory device" is a general term and can be a memory chip (package), a memory die or any portion of a memory die.

Although using three-dimensional NAND devices as examples, in various applications and designs, the disclosed structures can also be applied in similar or different semiconductor devices to, e.g., to improve metal connections or wiring. The specific application of the disclosed structures should not be limited by the embodiments of the present disclosure.

FIG. 1 illustrates a top-down view of an exemplary three-dimensional (3D) memory device 100, according to some embodiments of the present disclosure. The 3D memory device 100 can be a memory die and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, wherein each memory cell can be addressed through interconnections such as bit lines and word lines. The bit lines and word lines can be laid out perpendicularly, forming an array of metal lines. The direction of bit lines and word lines are labeled as "BL" and "WL" in FIG. 1. In this disclosure, memory blocks 103 is also referred to as "memory arrays".

The 3D memory device 100 also includes a periphery regions 105, an area surrounding memory planes 101. The periphery region 105 contains peripheral circuits to support functions of the memory array, for example, page buffers, row and column decoders and sense amplifiers.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

In some embodiments, the memory arrays and the peripheral circuits of the 3D memory device 100 can be formed on different substrates and can be joined together to form the 3D memory device 100 through wafer bonding. In this example, through array contact structures can provide vertical interconnects between the memory arrays and peripheral circuits, thereby reducing metal levels and shrinking die size. Detailed structure and method of 3D memory with hybrid bonding is described in co-pending U.S. patent application, titled "Hybrid Bonding Contact Structure of Three-Dimensional Memory Device," (application Ser. No. 16/046,852 and filed on Jul. 26, 2018), which is incorporated herein by reference in its entirety.

Figure 2:
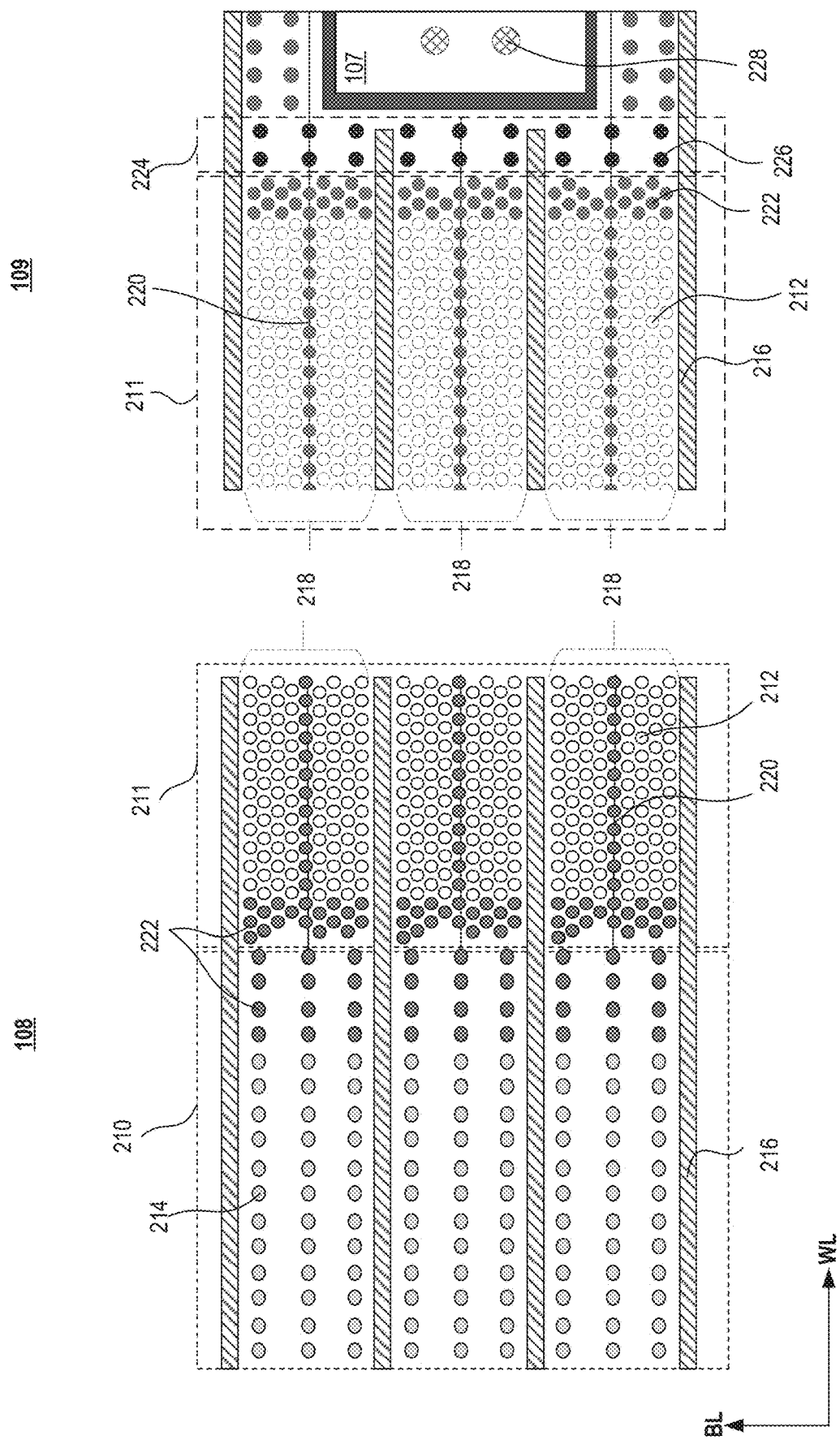
FIG. 2A-2B illustrate schematic top-down views of some regions of 3D memory die, according to some embodiments of the present disclosure.

Referring to FIG. 2A, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact for an array of memory strings 212 in channel structure regions 211. A top select gate cut 220 can be disposed in the middle of each memory finger 218 to divide a top select gate (TSG) of the memory finger 218 into two portions, and thereby can divide a memory finger into two programmable (read/write) pages. While erase operation of a 3D NAND memory can be carried out at memory block level, read and write operations can be carried out at memory page level. A page can be kilobytes (KB) in size. In some embodiments, region 108 also includes dummy memory strings 222 for process variation control during fabrication and/or for additional mechanical support.

Referring to FIG. 2B, an enlarged top-down view of a region 109 in FIG. 1 is illustrated, according to some embodiments of the present disclosure. The region 109 of the 3D memory device 100 can include the channel structure region 211, a through array contact region 107, and a top select gate (TSG) staircase region 224.

The channel structure region 211 in the region 109 can be similar to the channel structure region 211 in region 108. The TSG staircase region 224 can include an array of TSG contacts 226 formed on the staircase structure. The TSG staircase region 224 can be disposed on the sides of the channel structure region 211 and adjacent to through array contact region 107 in the top-down view. Multiple through array contacts 228 can be formed in the through array contact region 107.

Figure 3:
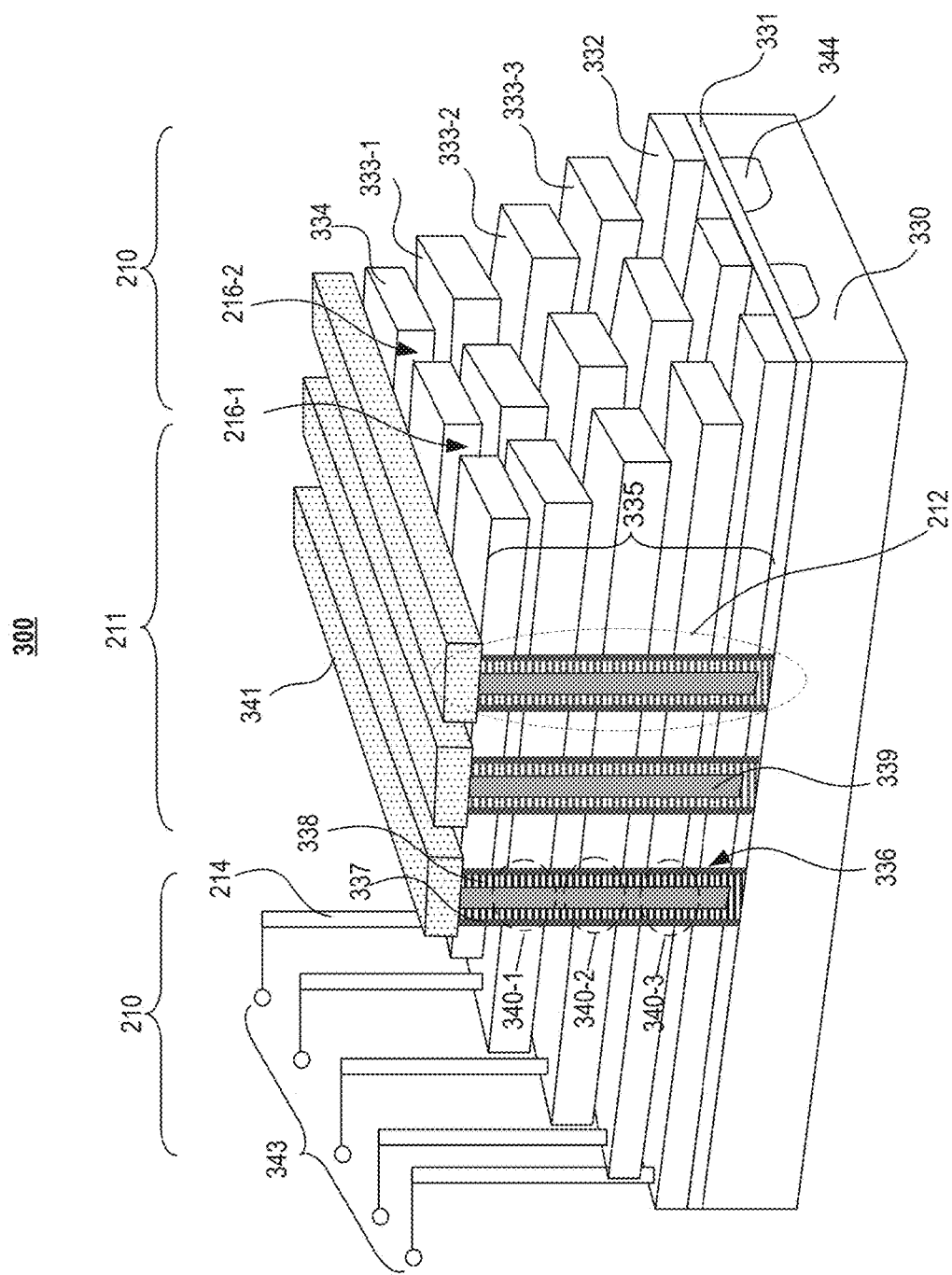
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)", stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. The memory array structure 300 further includes a plurality of bit lines (BLs) 341 connected to the memory strings 212 over the TSGs 334. The memory array structure 300 also includes a plurality of metal interconnect lines 343 connected to the gate electrodes through a plurality of contact structures 214. The edge of the film stack 335 is configured in a shape of staircase to allow an electrical connection to each tier of the gate electrodes. The channel structure region 211 and the staircase region 210 correspond to the channel structure region 211 and the staircase region 210 in the top-down view of FIG. 2A, wherein one of the staircase region 210 in FIG. 3 can be used as TSG staircase region 230 for TSG connection.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, through array contact, TSG cut, common source contact and dummy channel structure. These structures are not shown in FIG. 3 for simplicity.

With the demand for higher storage capacity in a NAND flash memory, the number of vertical tiers of 3D memory cells 340 or word lines 333 increases accordingly, leading to more process complexity and higher manufacturing cost. When increasing the tiers of memory cells 340 or word lines 333 of the memory array structure 300, it becomes more challenging to etch deeper channel holes 336 for the memory strings 212 and also more challenging to form contact structures 214 on the staircase structures. For example, to form the contact structures 214 on a large number of vertically stacked word lines (gate electrodes), a high aspect ratio etching is needed to form contact holes, followed by a high aspect ratio deposition of conductive materials inside the contact holes. To reduce cost per bit for a 3D memory, dimensions of the memory structures are reduced to allow fabrication of more memory blocks on a wafer. However the increased word line stack also leads to wider staircase structures in a horizontal direction parallel to the substrate surface, resulting in a wider staircase region 210 and less storage density.

To alleviate etching and deposition difficulties with more and more vertically stacked word lines, portions of a 3D memory device can be formed on two or more wafers and then joined together through wafer bonding or flip-chip bonding. Alternatively, a 3D memory device can be formed by sequentially stacking multi-sessions, wherein each session contains a stack of word lines with less number of tiers. However larger lateral dimensions of staircase structures due to vertically stacked word lines still limits the storage density.

Various embodiments in the present disclosure describe a structure and method of a 3D memory with coaxial contact structures, each providing electrical contacts to two or more conductive layers of the staircase structure. By sharing contact structures between multiple conductive layers, the dimension of the staircase region 210 (in FIG. 2) can be reduced. Memory density and cost per bit of the 3D NAND memory can be improved accordingly.

Figure 4:
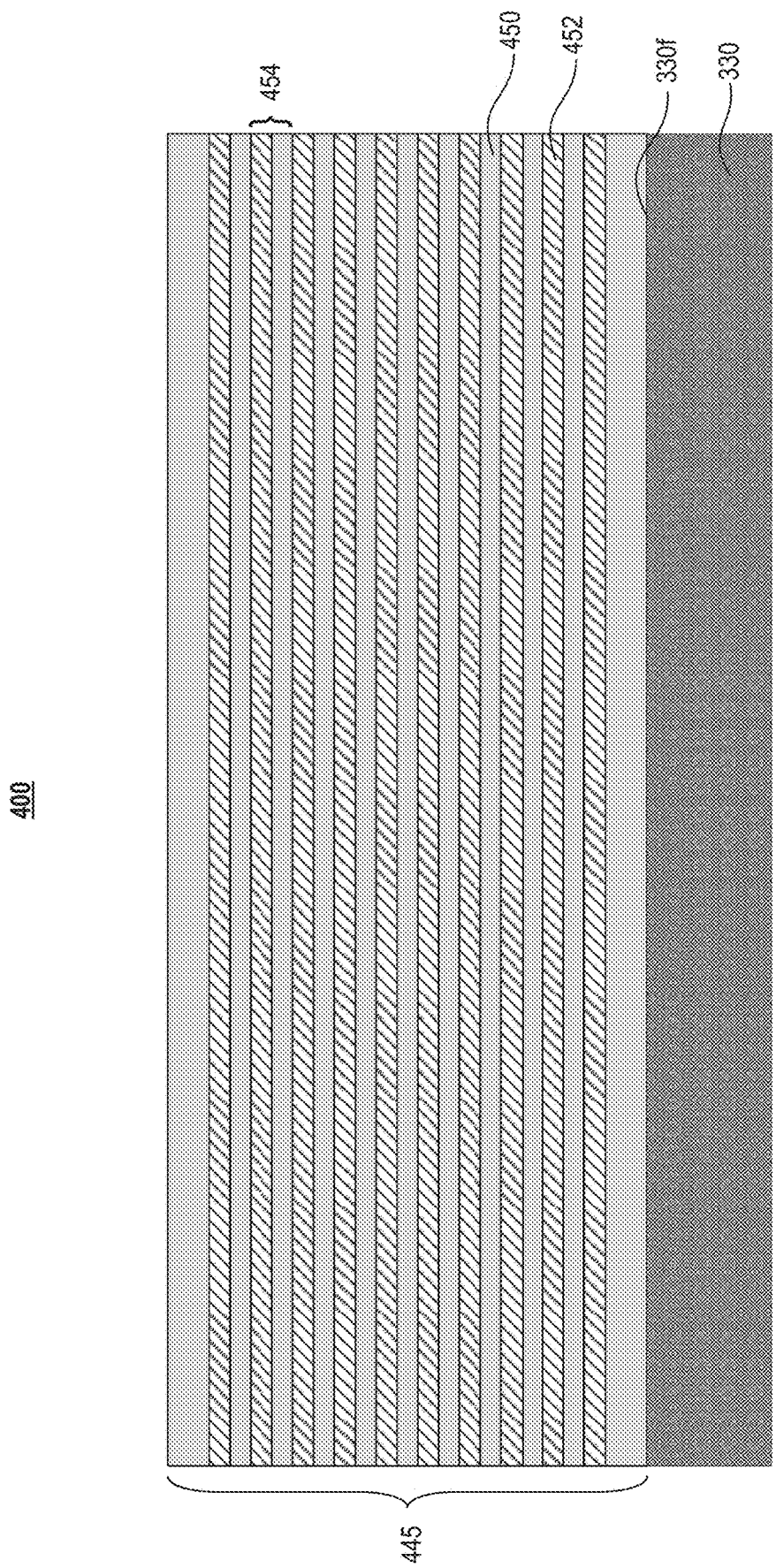
FIG. 4-15 illustrate schematic cross-sectional views of an exemplary 3D memory structure at certain fabricating stages, according to some embodiments of the present disclosure.

FIG. 4 illustrates a cross-sectional view of an exemplary structure 400 of a three-dimensional memory device, according to some embodiments, wherein the structure 400 includes a substrate 330 and a dielectric film stack 445. The cross-sectional views of FIG. 4-17D are along WL direction in FIG. 2A.

Substrate 330 can provide a platform for forming subsequent structures. In some embodiments, the substrate 330 includes any suitable material for forming the three-dimensional memory device. For example, the substrate 330 can include any other suitable material, for example, silicon, silicon germanium, silicon carbide, silicon on insulator (SOI), germanium on insulator (GOI), glass, gallium nitride, gallium arsenide, III-V compound, and/or any combinations thereof.

A front surface 330$f$ of the substrate 330 is also referred to as a "main surface" of the substrate herein. Layers of materials can be disposed on the front surface 330$f$ of the substrate. A "topmost" or "upper" layer is a layer farthest or farther away from the front surface 330$f$ of the substrate. A "bottommost" or "lower" layer is a layer closest or closer to the front surface 330$f$ of the substrate.

In some embodiments, peripheral devices can be formed in the periphery region 105 on the front surface 330$f$ of the substrate 330. In some embodiments, active device areas can be formed in the memory blocks 103 on the front surface 330$f$ of the substrate 330. In some embodiments, the substrate 330 can further include an insulating film 331 on the front surface 330$f$. The insulating film 331 can be made of the same or different material from the dielectric film stack.

The peripheral devices can include any suitable semiconductor devices, for example, metal oxide semiconductor field effect transistors (MOSFETs), diodes, resistors, capacitor, etc. The peripheral devices can be used in the design of digital, analog and/or mixed signal circuits supporting the storage function of the memory core, for example, row and column decoders, drivers, page buffers, sense amplifiers, timing and controls.

The active device areas in the memory blocks are surrounded by isolation structures, such as shallow trench isolation. Doped regions, such as p-type doped and/or n-type doped wells, can be formed in the active device area according to the functionality of the array devices in the memory blocks.

The dielectric film stack 445 extends in a lateral direction that is parallel to the front surface 330$f$ of the substrate 330. The dielectric film stack 445 includes a dielectric layer 450 (also referred to as "first dielectric layer") and a sacrificial layer 452 (also referred to as "second dielectric layer") alternatingly stacked on each other, wherein the dielectric layer 450 is configured to be the bottommost and the topmost layers of the dielectric film stack 445. In this configuration, each sacrificial layer 452 is sandwiched between two dielectric layers 450, and each dielectric layer 450 is sandwiched between two sacrificial layers 452 (except the bottommost and the topmost layer).

The dielectric layer 450 and the underlying sacrificial layer 452 are also referred to as an alternating dielectric layer pair 454. The formation of the dielectric film stack 445 can include disposing the dielectric layers 450 to each have the same thickness or to have different thicknesses. Example thicknesses of the dielectric layers 450 can range from 10 nm to 500 nm. Similarly, the sacrificial layer 452 can each have the same thickness or have different thicknesses. Example thicknesses of the sacrificial layer 452 can range from 10 nm to 500 nm.

Although only 21 total layers are illustrated in the dielectric film stack 445 in FIG. 4, it should be understood that this is for illustrative purposes only and that any number of layers may be included in the dielectric film stack 445.

In some embodiments, the dielectric film stack 445 can include layers in addition to the dielectric layer 450 and the sacrificial layer 452, and can be made of different materials and with different thicknesses.

In some embodiments, the dielectric layer 450 includes any suitable insulating materials, for example, silicon oxide, silicon oxynitride, silicon nitride, TEOS or silicon oxide with F-, C-, N-, and/or H-incorporation. The dielectric layer 450 can also include high-k dielectric materials, for example, hafnium oxide, zirconium oxide, aluminum oxide, tantalum oxide, or lanthanum oxide films.

The formation of the dielectric layer 450 on the substrate 330 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), thermal oxidation, nitridation, any other suitable deposition method, and/or combinations thereof.

In some embodiments, the sacrificial layer 452 includes any suitable material that is different from the dielectric layer 450 and can be removed selectively. For example, the sacrificial layer 452 can include silicon oxide, silicon oxynitride, silicon nitride, TEOS, poly-crystalline silicon, poly-crystalline germanium, poly-crystalline germanium-silicon, and any combinations thereof. In some embodiments, the sacrificial layer 452 also includes amorphous semiconductor materials, such as amorphous silicon or amorphous germanium. The sacrificial layer 452 can be disposed using a similar technique as the dielectric layer 450, such as CVD, PVD, ALD, thermal oxidation or nitridation, or any combination thereof.

In some embodiments, the dielectric layer 450 can be silicon oxide and the sacrificial layer 452 can be silicon nitride.

Figure 5:
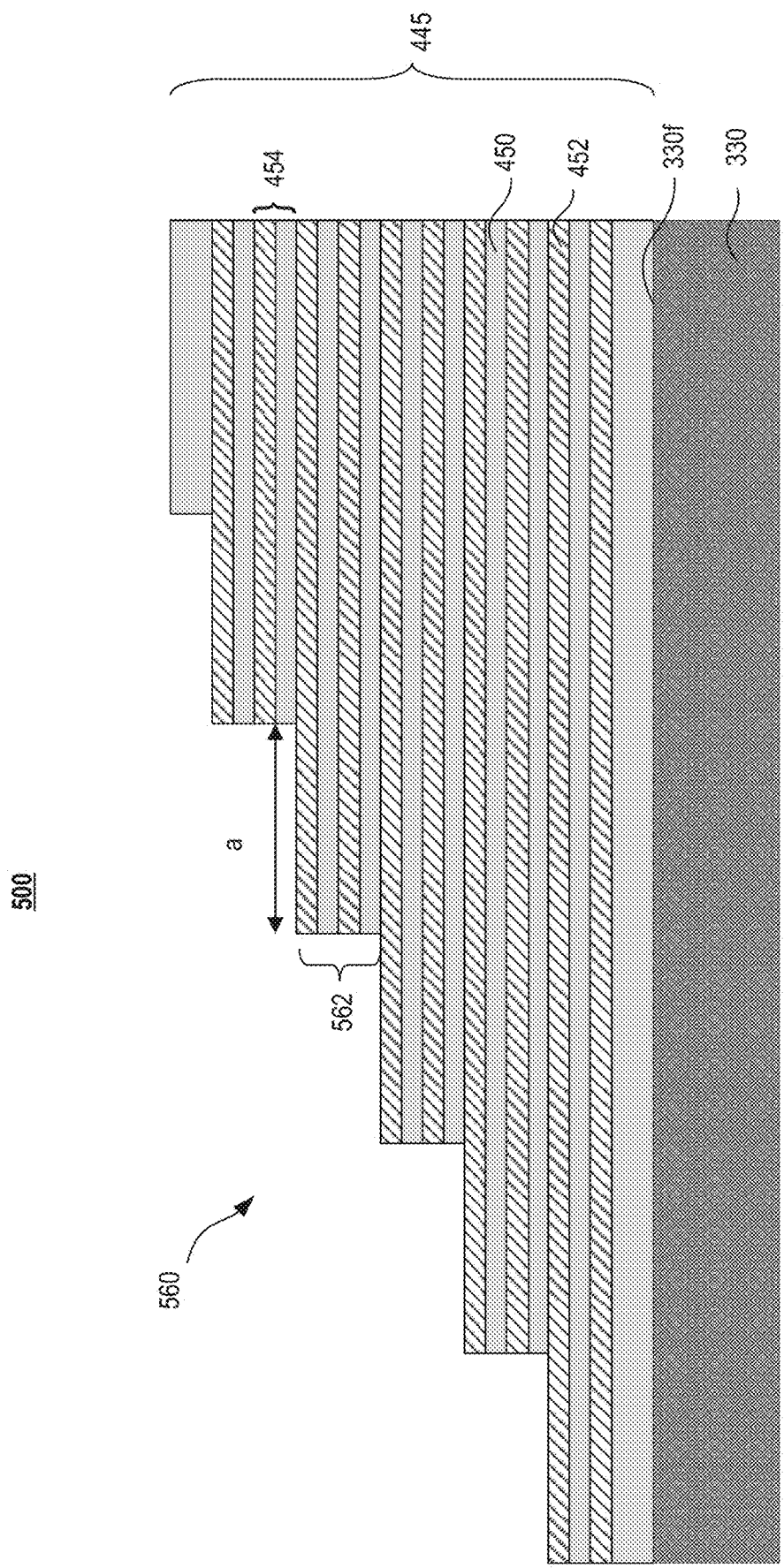

FIG. 5 illustrates a cross-sectional view of an exemplary structure 500 of a three dimensional memory device, according to some embodiments, wherein the structure 500 includes a dielectric staircase 560 formed in the dielectric film stack 445. In the dielectric staircase 560, a dielectric staircase step 562, or a "staircase layer", refers to a layer stack with the same lateral dimension in a surface parallel to the substrate surface 330f. Each dielectric staircase step 562 terminates at a shorter length than the staircase step underneath, with a lateral dimension "a" shown in FIG. 5.

In some embodiments, each dielectric staircase step 562 includes two or more alternating dielectric layer pairs 454. Each dielectric staircase step 562 can have a same number of alternating dielectric layer pairs or a different number of alternating dielectric layer pairs. As an example, FIG. 5 depicts the dielectric staircase 560 with two alternating dielectric layer pairs 454.

The plural steps of the dielectric staircase 560 can be formed by applying a repetitive etch-trim process on the dielectric film stack 445 using a patterning mask (not shown). In some embodiments, the patterning mask can include a photoresist or carbon-based polymer material. The patterning mask can be removed after forming the dielectric staircase 560.

The etch-trim process includes an etching process and a trimming process. During the etching process, a portion of each dielectric staircase step 562 with exposed surface can be removed. The remaining portion of each dielectric staircase step 562, either covered by upper levels of staircase steps or covered by the patterning mask, is not etched. The etch depth is a thickness of the dielectric staircase step 562. In some embodiments, the thickness of the dielectric staircase step 562 is the total thickness of two or more alternating dielectric layer pairs 454. In the example shown in FIG. 5, the thickness of a dielectric staircase step 562 is the thickness of two alternating dielectric layer pairs 454. The etching process for the dielectric layer 450 can have a high selectivity over the sacrificial layer 452, and/or vice versa. Accordingly, an underlying alternating dielectric layer pair 454 can function as an etch-stop layer. By switching etching process for each layer, the dielectric staircase step 562 with multiple alternating dielectric layer pairs 454 can be etched during one etching cycle. And as a result, one staircase step is formed during each etch-trim cycle.

In some embodiments, the dielectric staircase step 562 can be etched using an anisotropic etching such as a reactive ion etch (RIE) or other dry etch processes. In some embodiments, the dielectric layer 450 is silicon oxide. In this example, the etching of silicon oxide can include RIE using fluorine based gases, for example, carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed etching approach can be used. In some embodiments, the sacrificial layer 452 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer stack should not be limited by the embodiments of the present disclosure.

The trimming process includes applying a suitable etching process (e.g., an isotropic dry etch or a wet etch) on the patterning mask such that the patterning mask can be pulled back laterally. The lateral pull-back dimension determines the lateral dimension "a" of each step of the dielectric staircase 560. After patterning mask trimming, one portion of the topmost dielectric staircase step 562 is exposed and the other portion of the topmost dielectric staircase step 562 remains covered by the patterning mask. The next cycle of etch-trim process resumes with the etching process.

In some embodiments, the patterning mask trimming process can include dry etching, such as RIE using $O_2$, Ar, $N_2$, etc.

In some embodiments, the topmost dielectric staircase step 562 can be covered by the dielectric layer 450. In some embodiments, the topmost dielectric staircase step 562 can further be covered by other dielectric materials. A process step of removing the dielectric layer 450 and/or the other dielectric materials can be added to the etching process of each etch-trim cycle to form the dielectric staircase 560.

Figure 6:
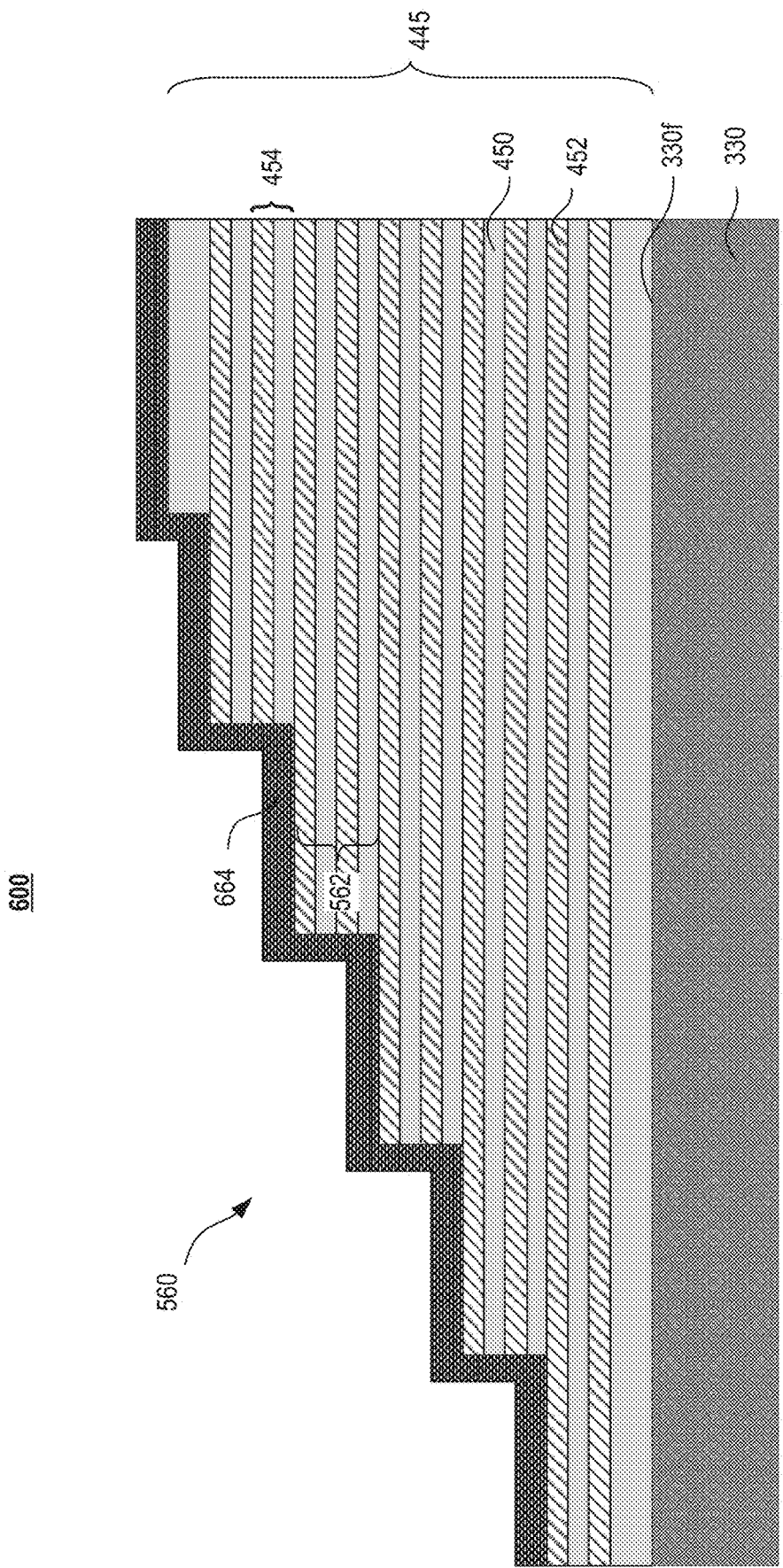

FIG. 6 illustrates a cross-sectional view of an exemplary structure 600 of a three dimensional memory device, according to some embodiments, wherein the structure 600 includes a barrier layer 664 disposed over the structure 500.

The barrier layer 664 covers the dielectric staircase 560 on both the top surfaces and sidewalls. In some embodiments, the barrier layer 664 can be an optional etch-stop layer. For example, the barrier layer 664 can be used as an etch-stop layer for protecting the underlying structure during contact hole etching processes. In some embodiments, a thickness of the barrier layer 664 on sidewalls can be the same as a thickness of the barrier layer 664 on the top surfaces. In some embodiments, the thickness of the barrier layer 664 on sidewalls can be different from the thickness of the barrier layer 664 on the top surfaces. In some embodiments, the barrier layer 664 can be made of similar material as the dielectric layer 450 using a similar technique.

Figure 7:
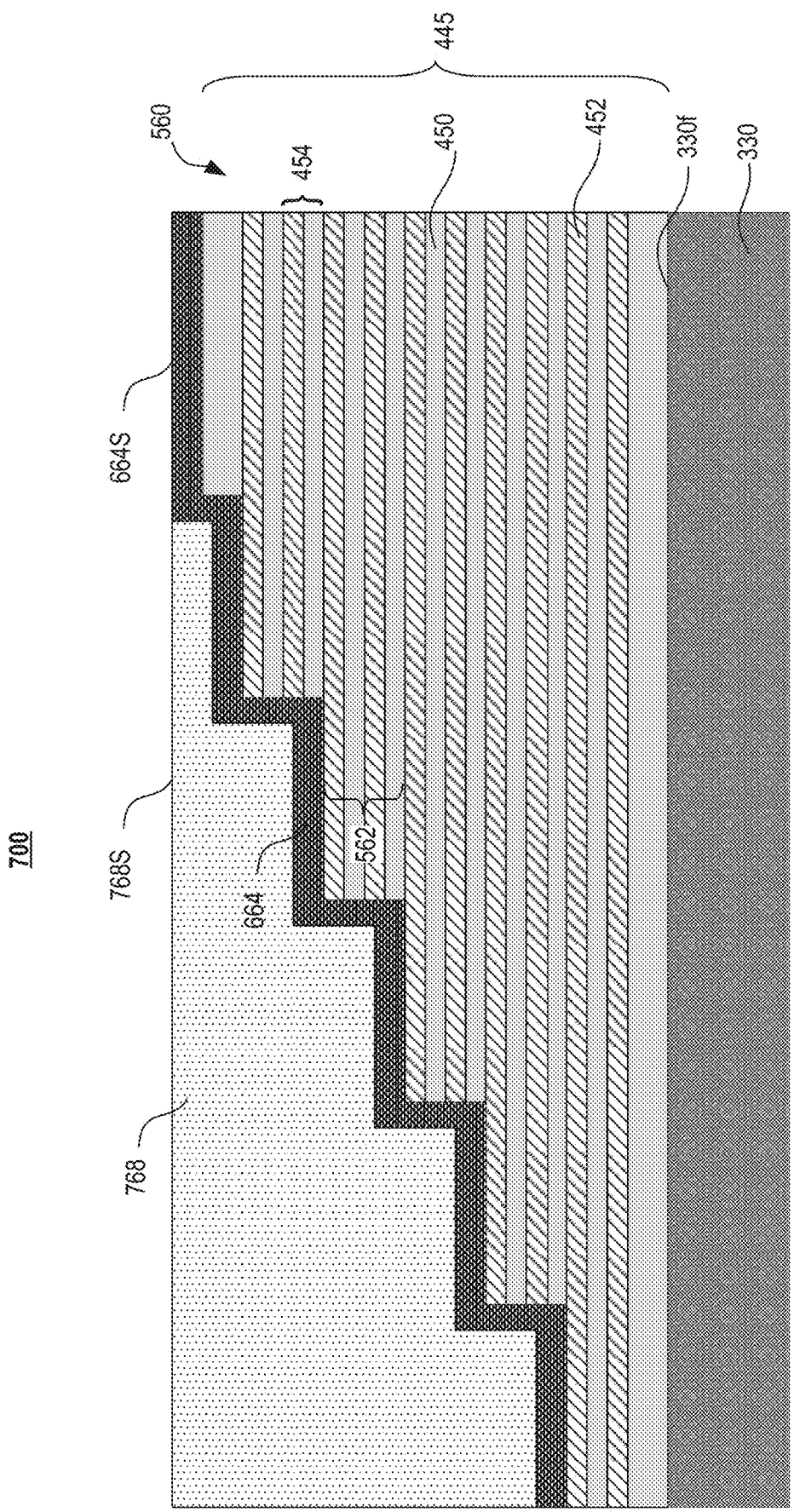

FIG. 7 illustrates a cross-sectional view of an exemplary structure 700 of a three dimensional memory device, according to some embodiments, wherein the structure 700 includes a first insulating layer 768 disposed over the structure 600.

The first insulating layer 768 can be disposed on dielectric staircase 560 after forming the barrier layer 664. The first insulating layer 768 can be made of any a suitable insulator and can be made of a similar material as the dielectric layer 450 using a similar technique. In some embodiments, the first insulating layer 768 can also include spin-on-glass, a mixture of silicon oxide and dopants (either boron or phosphorous) that is suspended in a solvent solution, and can be disposed using processes, for example, spin-coating. In some embodiments, the first insulating layer 768 can include a low-k dielectric material, such as carbon-doped oxide (CDO or SiOC or SiOC:H), or fluorine doped oxide (SiOF), etc. The low-k dielectric material can be disposed by CVD, PVD, sputtering, etc.

In some embodiments, a planarization process, for example RIE etch-back or chemical mechanical polishing (CMP), can be performed to form a coplanar surface, parallel to the surface 330f of the substrate 330. In some embodiments, the top surface 768S of the first insulating layer 768 can be coplanar with the top surface 664S of the uppermost portion of the barrier layer 664. In this example, the barrier layer 664 can be used as a polish-stop.

Figure 8:
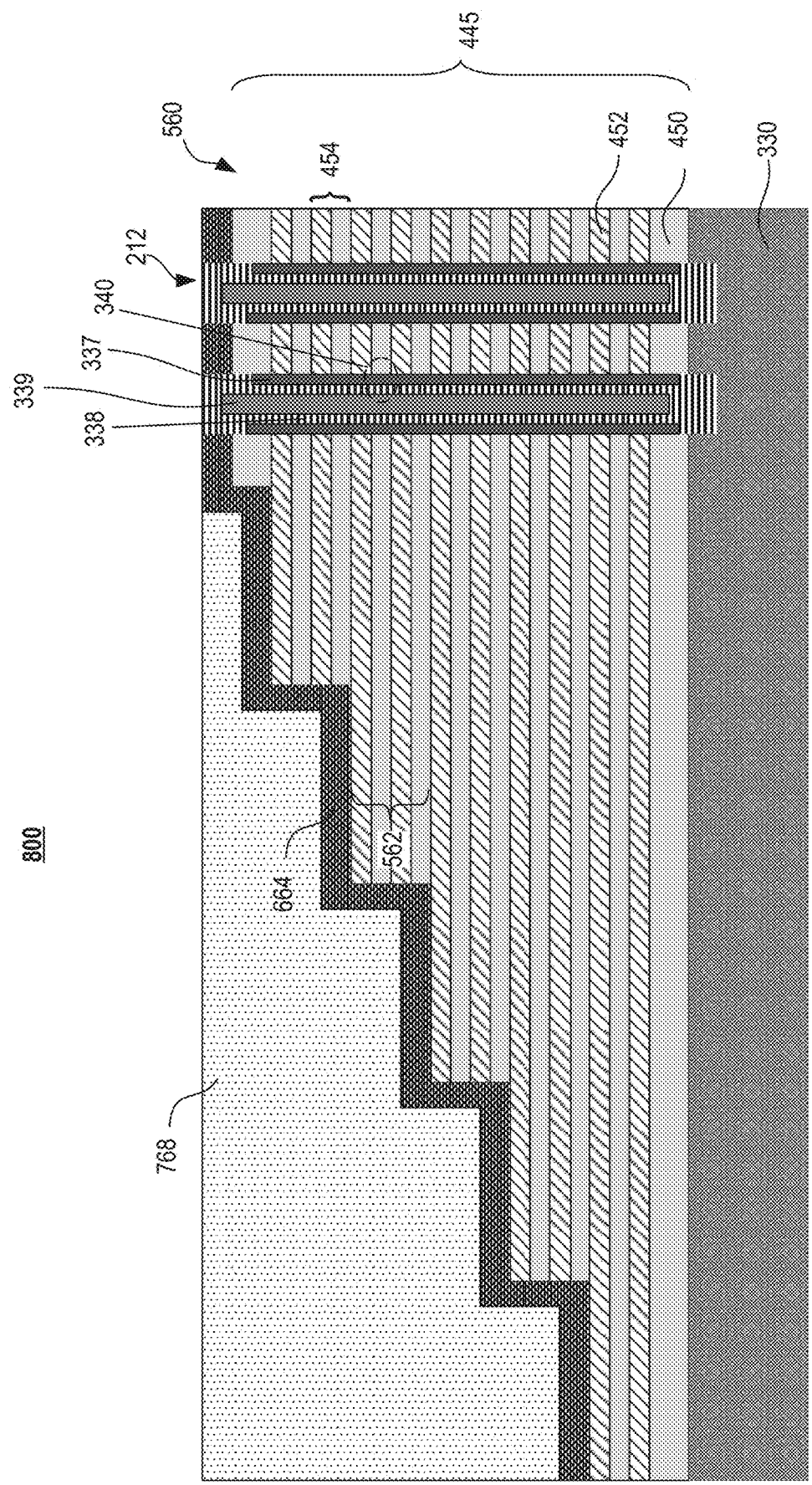

FIG. 8 illustrates a cross-sectional view of an exemplary structure 800 of a three dimensional memory device, according to some embodiments, wherein the structure 800 includes a plurality of memory strings 212 through the dielectric film stack 445. The memory strings 212 correspond to the memory strings 212 in FIGS. 2A-2B and FIG. 3. For illustrative purpose, two memory strings are shown in FIG. 8. Each memory string 212 extends through the dielectric film stack 445 of alternating dielectric layer pairs, and includes a memory film 337 over the inner surface of memory strings 212, a channel layer 338 over the memory film 337, and a core filling film 339 surrounded by the channel layer 338. Detailed structure and method of the NAND memory string is described in the co-pending U.S. patent application, titled "Method for Forming Gate Structure of Three-Dimensional Memory Device," (application Ser. No. 16/047,158 and filed on Jul. 27, 2018), which is incorporated herein by reference in its entirety.

Figure 9:
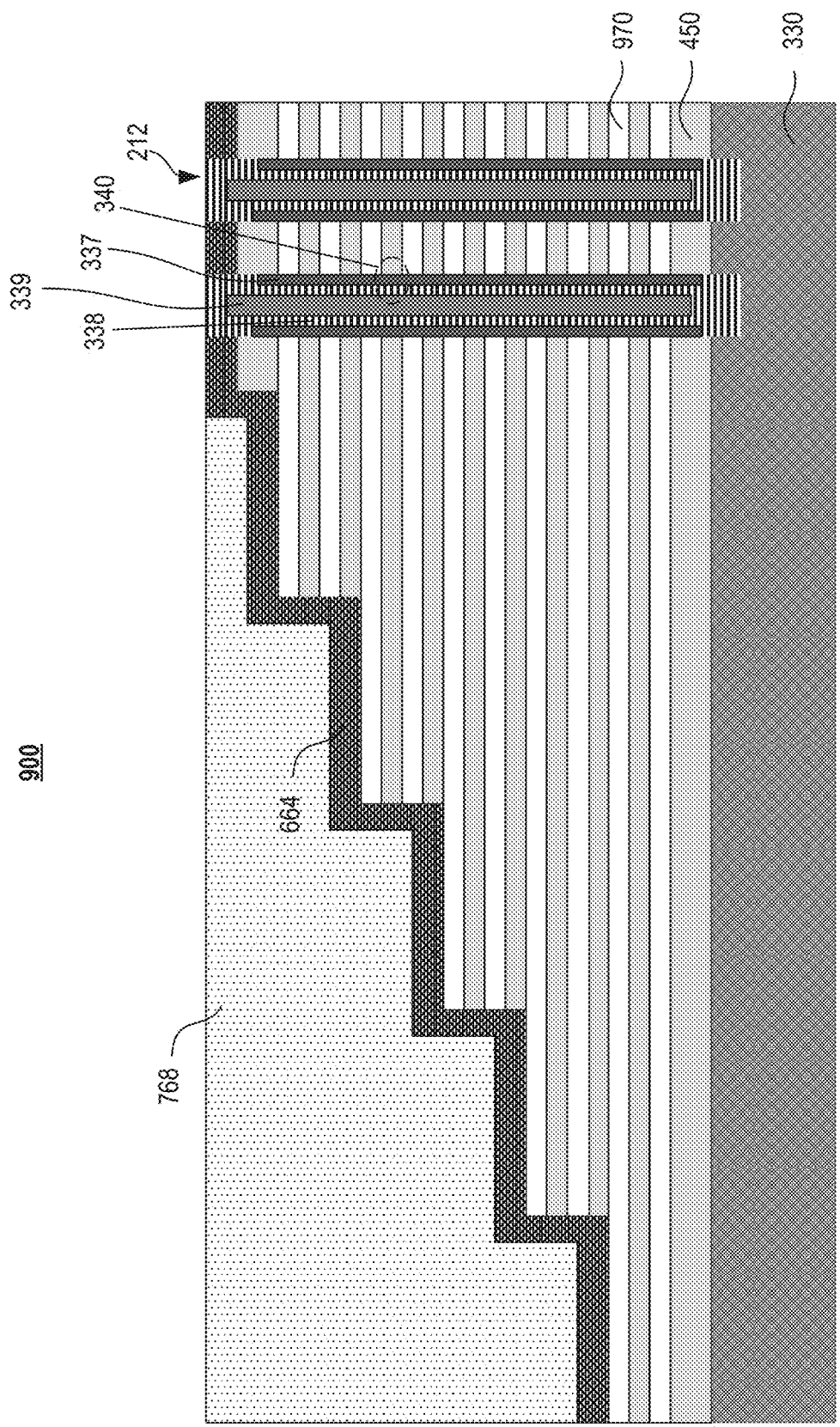

FIG. 9 illustrates a cross-sectional view of an exemplary structure 900 of a three dimensional memory device (along WL direction), according to some embodiments, wherein the sacrificial layers 452 are removed and a plurality of horizontal tunnels 970 are formed.

After forming the memory strings 212, a plurality of slit structure openings can be formed along WL directions (see FIGS. 2A-2B and FIG. 3). These slit structure openings extend through the dielectric film stack 445. The sacrificial layers 452 can then be removed from the openings of the slit structures 216 along BL direction (perpendicular to WL direction, e.g., perpendicular to the cross-section shown in FIG. 9).

The sacrificial layers 452 can be removed by any suitable etching process, e.g., an isotropic dry etch or wet etch, that is selective over the dielectric layers 450, such that the etching process can have minimal impact on the dielectric layer 450. In some embodiments, the sacrificial layer 452 can be silicon nitride. In this example, the sacrificial layer 452 can be removed by RIE using one or more etchants of $CF_4$, $CHF_3$, $C_4F_8$, $C_4F_6$, and $CH_2F_2$. In some embodiments, the sacrificial layer 452 can be removed using wet etch, such as phosphoric acid.

After removing the sacrificial layers 452, sidewalls of the memory film 337 are exposed in the horizontal tunnels 970.

Figure 10:
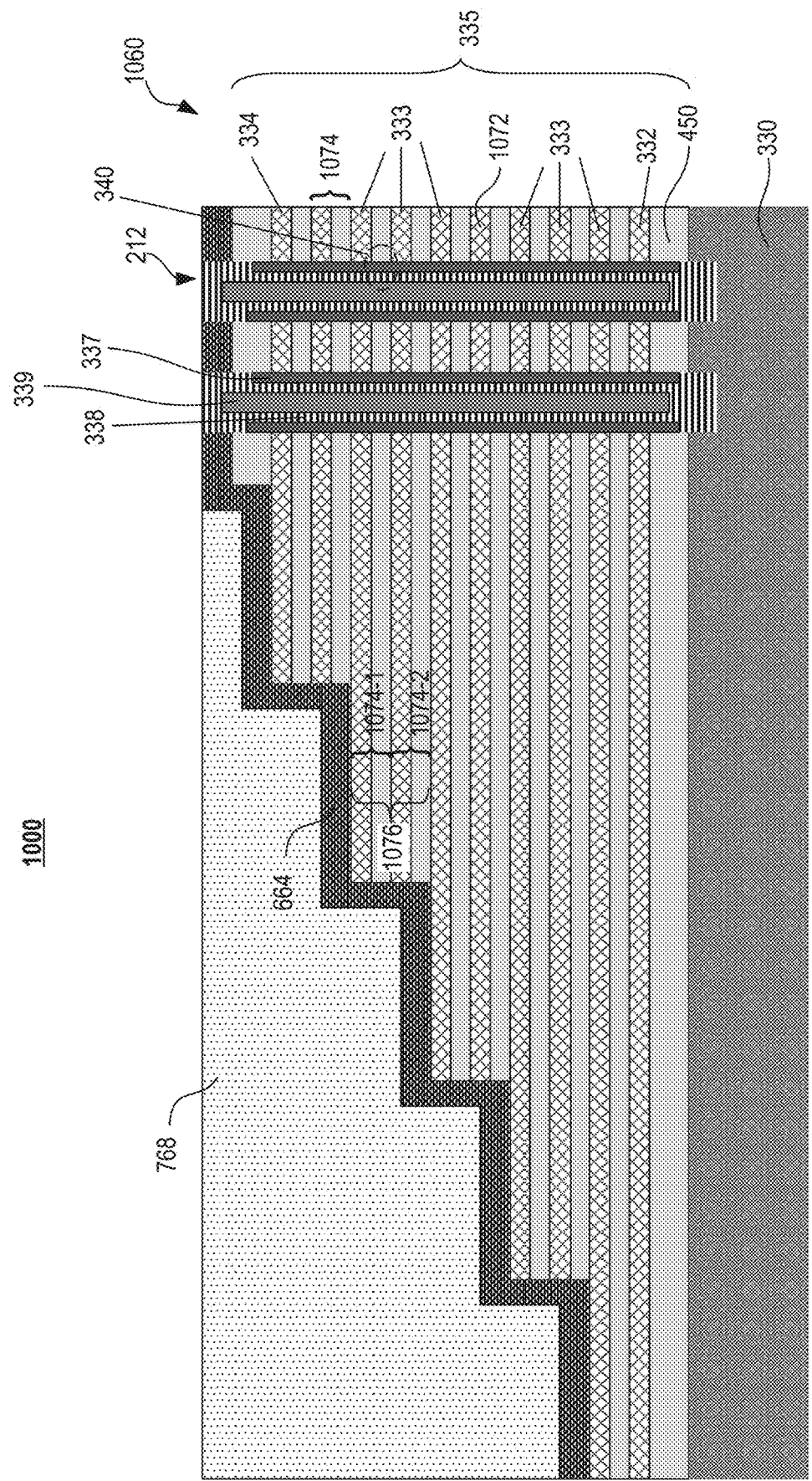

FIG. 10 illustrates a cross-sectional view of an exemplary structure 1000 of a three dimensional memory device, according to some embodiments, wherein the structure 1000 includes the film stack 335 of alternating conductive and dielectric layers (e.g., corresponding to the film stack 335 in FIG. 3). The film stack 335 of alternating conductive and dielectric layers includes conductive layers 1072 sandwiched between the dielectric layers 450. In structure 1000, each staircase step 1076 includes two or more conductive and dielectric layer pairs 1074, each conductive and dielectric layer pair 1074 having one conductive layer 1072 and one dielectric layer 450. In FIG. 10, as an example, each staircase step 1076 includes two conductive and dielectric layer pairs 1074-1 and 1074-2, referred to as an "upper layer pair" and a "lower layer pair", respectively. After disposing the conductive layers 1072 inside the plurality of horizontal tunnels, the dielectric staircase 560 with alternating dielectric and sacrificial layers is now changed into a staircase structure 1060 with alternating conductive and dielectric layers.

The conductive layer 1072 can include any suitable conductive material that is suitable for a gate electrode, e.g., tungsten (W), aluminum (Al), copper (Cu), cobalt (Co), titanium (Ti), tantalum (Ta), titanium nitride (TiN), tantalum nitride (TaN), and/or any combination thereof. The conductive material can fill the horizontal tunnel 970 using a suitable deposition method such as CVD, physical vapor deposition (PVD), plasma-enhanced CVD (PECVD), sputtering, thermal evaporation, e-beam evaporation, metal-organic chemical vapor deposition (MOCVD), and/or ALD. In some embodiments, the conductive layers 1072 include tungsten (W) deposited by CVD.

In some embodiments, the conductive layer 1072 can also be poly-crystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, or arsenic. In some embodiments, the conductive layer 1072 can also be amorphous semiconductors.

In some embodiments, the conductive layer 1072 can be made from a metal silicide, including $WSi_x$, $CoSi_x$, $NiSi_x$, or $AlSi_x$, etc. The forming of the metal silicide material can include forming a metal layer and a poly-crystalline semiconductor using similar techniques described above. The forming of metal silicide can further include applying a thermal annealing process on the deposited metal layer and the poly-crystalline semiconductor layer, followed by removal of unreacted metal.

In some embodiments, a gate dielectric layer can be disposed in the horizontal tunnels 970 prior to the conductive layer 1072 (not shown in FIG. 10) to reduce leakage current between adjacent word lines (gate electrodes) and/or to reduce leakage current between gate and channel. The gate dielectric layer can include silicon oxide, silicon nitride, silicon oxynitride, and/or any suitable combinations thereof. The gate dielectric layer can also include high-k dielectric materials, such as hafnium oxide, zirconium oxide, aluminum oxide, tantalum oxide, lanthanum oxide, and/or any combination thereof. The gate dielectric layer can be disposed by one or more suitable deposition processes, such as CVD, PVD, and/or ALD.

The conductive layers 1072 function as gate electrodes at the intersection with memory strings 212. In FIG. 10, the ten conductive layers 1072 can form ten gate electrodes for each memory string 212, e.g., TSG 334, LSG 332 and eight control gates 333. Corresponding to eight control gates 333, each memory string 212 can have eight memory cells 340. It is noted that the number of memory strings and memory cells are shown for illustrative purposes in FIG. 10, and can be increased for higher storage capacity.

After forming gate electrodes, conductive materials can be removed and insulating materials can be deposited in the openings to form slit structures 216, separating a memory block into multiple programmable and readable memory fingers (see FIG. 2A-2B).

In some embodiments, the doped source line regions 344 in portions of substrate 330 can be formed using techniques such as ion implantation (see FIG. 3). In this example, a conductive core can be inserted in the slit structure 216 to form common source contact to the doped source line region 344.

Structure 1000 can include other structures, for example, through array contact (TAC), TSG cut, common source contact and dummy channel structure, which are not shown in FIG. 10 for simplicity.

Figure 11:
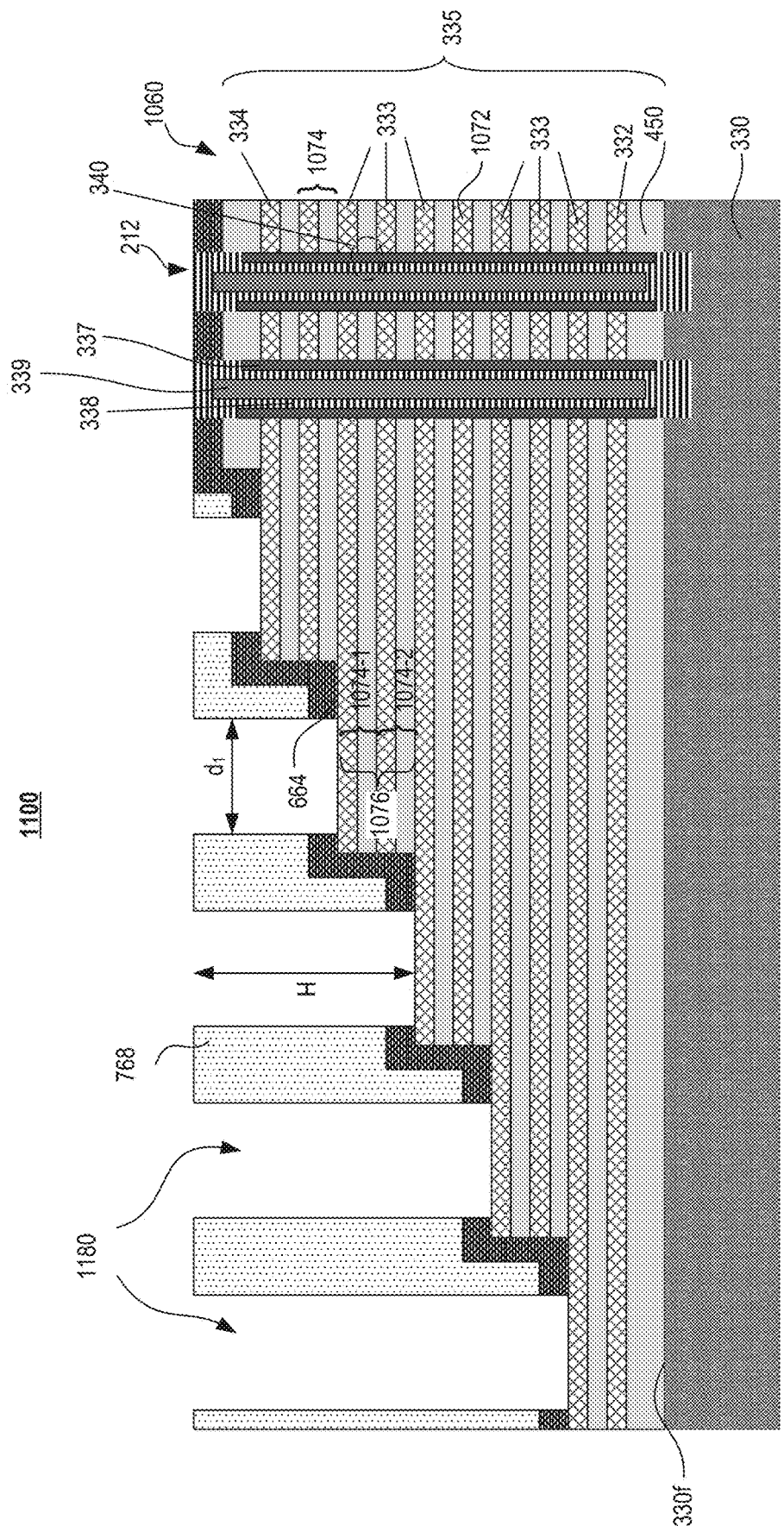

FIG. 11 illustrates a cross-sectional view of an exemplary structure 1100 of a three dimensional memory device, according to some embodiments, wherein the structure 1100 includes a plurality of first contact holes 1180 in the first insulating layer 768 with a diameter of "$d_1$". In FIG. 11, one first contact hole 1180 is shown for each staircase step 1076, which is only for illustrative purpose. Multiple first contact holes 1180 can be formed on each staircase step 1076. In some embodiments, there are no first contact holes 1180 on dummy staircase levels.

In some embodiments, photoresist or polymer material can be used as a mask layer to etch the first contact holes 1180. Due to the topology of the staircase structure, depth "H" of the first contact hole 1180 from the top surface to staircase step depends on the location of each step. For a 3D NAND memory with many tiers of word lines, the first contact holes 1180 for the lower staircase steps can be much deeper than the first contact holes 1180 for the upper staircase steps. Therefore, the first contact hole 1180 for the staircase step 1076 closer to the surface 330f of the substrate 330 requires longer etch time than the first contact hole 1180 for the staircase step 1076 away from the surface 330f of the substrate 330. A selective etching process can be used such that the etching rate of the first insulating layer 768 is higher than the conductive layer 1072 and/or the barrier layer 664.

In some embodiments, during the etching process for first contact holes 1180, the barrier layer 664 can function as an etch-stop layer and can protect the underlying structure until all the first contact holes 1180 are formed on top of the barrier layer 664 for all levels of the staircase structure 1060. And then the portions of the barrier layer 664 inside the first contact holes 1180 can be removed using the same mask layer. In some embodiments, when a gate dielectric layer is disposed on the conductive layer 1072, the etching also includes removing the gate dielectric layer inside the first contact holes 1180.

The first contact holes 1180 extend through the first insulating layer 768, the barrier layer 664, and the optional gate dielectric layer, exposing a portion of the conductive layer 1072 of the upper layer pair 1074-1 in each staircase step 1076. In some embodiments, the first insulating layer 768 is silicon oxide and the barrier layer is a combination of silicon nitride and silicon oxide. In this example, etching silicon oxide can use anisotropic RIE with chemical etchant, for example, $CF_4$, $CHF_3$, $C_2F_6$, $C_3F_6$, and/or any combination thereof. Etching silicon nitride can use RIE with chemical etchant, for example, $O_2$, $N_2$, $CF_4$, $NF_3$, $Cl_2$, HBr, $BCl_3$, and/or combinations thereof.

The diameter "$d_1$" of the first contact holes 1180 is preferably smaller than the lateral dimension "a" of the staircase structure 1060, and will be discussed in detail in the subsequent processes.

Figure 12:
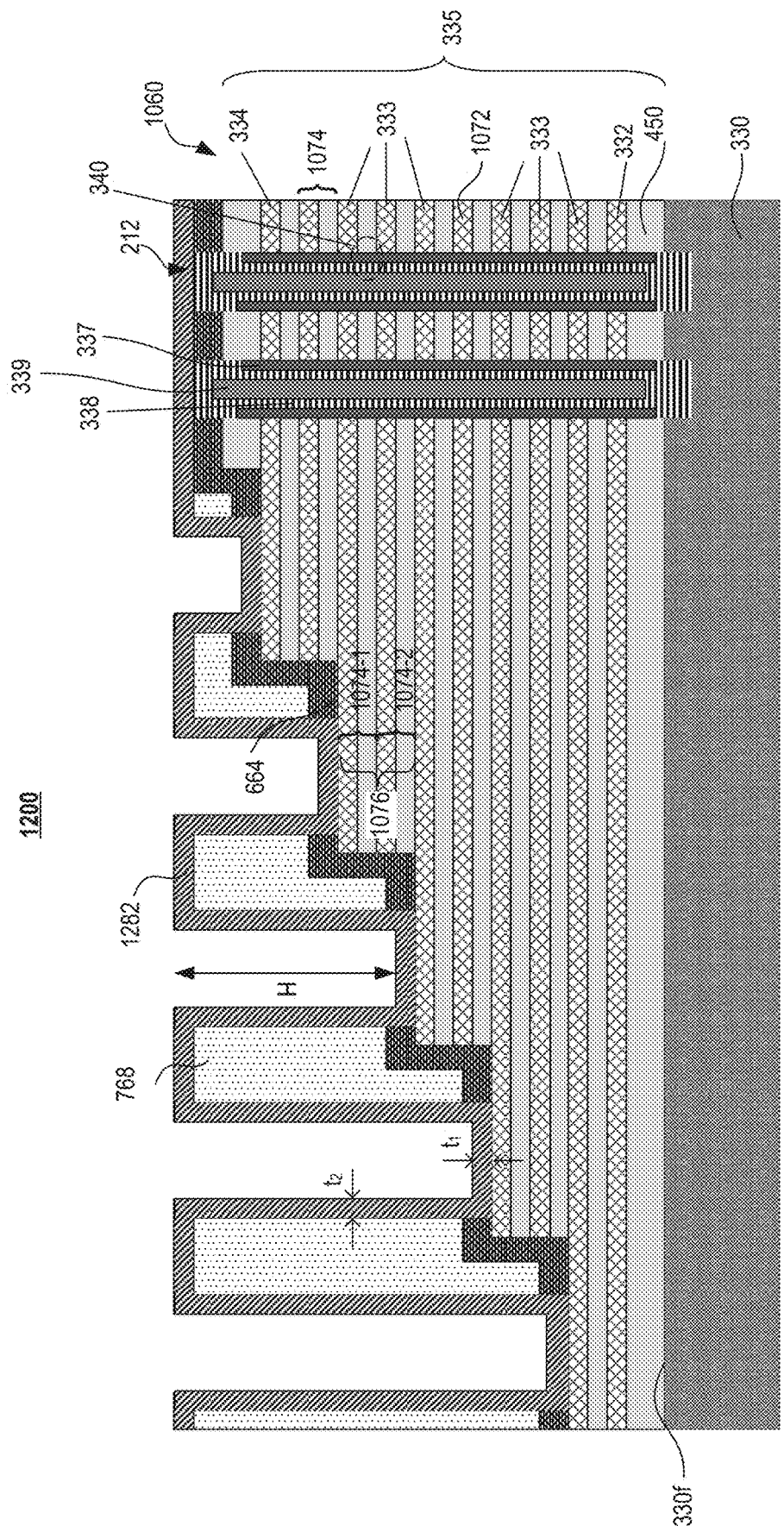

FIG. 12 illustrates a cross-sectional view of an exemplary structure 1200 of a three dimensional memory device, according to some embodiments, wherein the structure 1200 includes a conductive film 1282, disposed over the structure 1100.

In some embodiments, the conductive film 1282 inside the first contact hole 1180 is in direct contact with the conductive layer 1072 of the upper layer pair 1074-1. The conductive film 1282 also covers a sidewall of the first contact hole 1180. The thickness "$t_1$" of the conductive film 1282 at the bottom of the first contact hole 1180 can be the same or different from the thickness "$t_2$" on the sidewall. The height of the conductive film 1282 inside the first contact hole 1180 is determined by the depth "H" of the first contact hole 1180.

The conductive film 1282 can include any suitable conductive material, for example, a metal or metallic compound such as tungsten (W), aluminum (Al), copper (Cu), cobalt (Co), titanium (Ti), tantalum (Ta), titanium nitride (TiN), tantalum nitride (TaN), and/or any combination thereof. The metal or metallic compound can be disposed using a suitable deposition method such as CVD, PVD, PECVD, sputtering, thermal evaporation, e-beam evaporation, MOCVD, and/or ALD.

The conductive film 1282 can also be a metal silicide, including WSix, CoSix, NiSix, or AlSix, etc. Metal silicide material can be formed by disposing a metal layer directly on a polycrystalline silicon layer inside the first contact hole 1180 and then applying a thermal annealing process followed by removal of unreacted metal.

In some embodiments, the conductive film 1282 includes a combination of TiN/W/TiN deposited by CVD.

Figure 13:
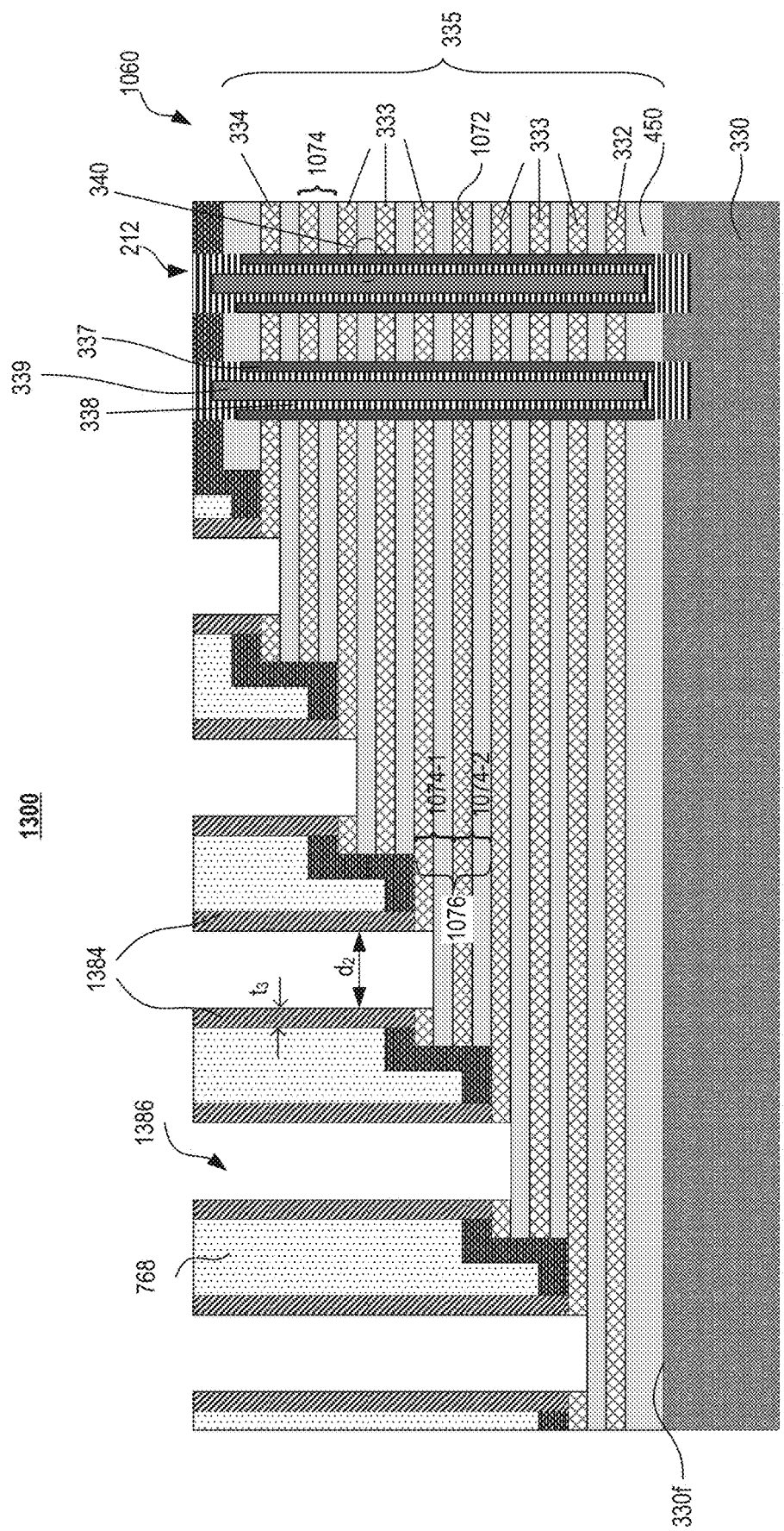

FIG. 13 illustrates a cross-sectional view of an exemplary structure 1300 of a three dimensional memory device, according to some embodiments, wherein the structure 1300 includes a plurality of conductive rings 1384 and a plurality of ring openings 1386. The conductive ring 1384 covers a sidewall of the first insulating layer 768. Bottom of the conductive ring 1384 contacts the conductive layer 1072 of the upper layer pair 1074-1.

The conductive ring 1384 can be formed by removing the conductive film 1282 and the conductive layer 1072 from the bottom of the ring openings 1386 using anisotropic etching, such as anisotropic RIE. In some embodiments, the conductive film 1282 and the conductive layer 1072 of the staircase structure 1060 can be tungsten. In this example, the anisotropic etching to form the conductive ring 1384 can include dry etching, for example RIE with a mixture of $O_2$ and $CF_4$, $CClF_3$, or $CBrF_3$.

Anisotropic RIE can include low-pressure plasma system to increase mean-free path of the ions and reduce random scattering. During anisotropic etching, the ions strike the structure 1300 in a vertical direction, perpendicular to the top surface 330f of the substrate 330. In some embodiment, the height "H" (shown in FIG. 12) of the conductive film 1282 can be greater than the total thickness of "$t_1$" at the bottom of the first contact holes 1180 and the thickness of the conductive layer 1072. Therefore, the conductive film 1282 and the conductive layer 1072 at the bottom of the first contact holes 1180 can be removed, while there is remaining conductive film on the sidewall of the first contact hole 1180, forming the conductive ring 1384.

The thickness "$t_3$" of the conductive ring 1384 depends on the initial sidewall thickness "$t_2$" of the conductive film 1282, as well as the sidewall profile of the first contact holes 1180. The thickness "$t_3$" can further depend on the RIE process conditions, for example, total etch time, ion direction angle, pressure, DC bias voltage and RF power, etc. To reduce parasitic resistance and metal line loading, the conductive ring 1384 with a greater thickness "$t_3$" is preferred. However trade-off between memory performance and area is needed for a limited diameter "$d_1$" of the first contact holes 1180.

For each staircase step 1076, the ring openings 1386 extend through the conductive layer 1072 of the upper layer stack 1074-1, with a smaller diameter "$d_2$" than the diameter "$d_1$" of the first contact holes 1180, as shown in FIG. 13.

Figure 14:
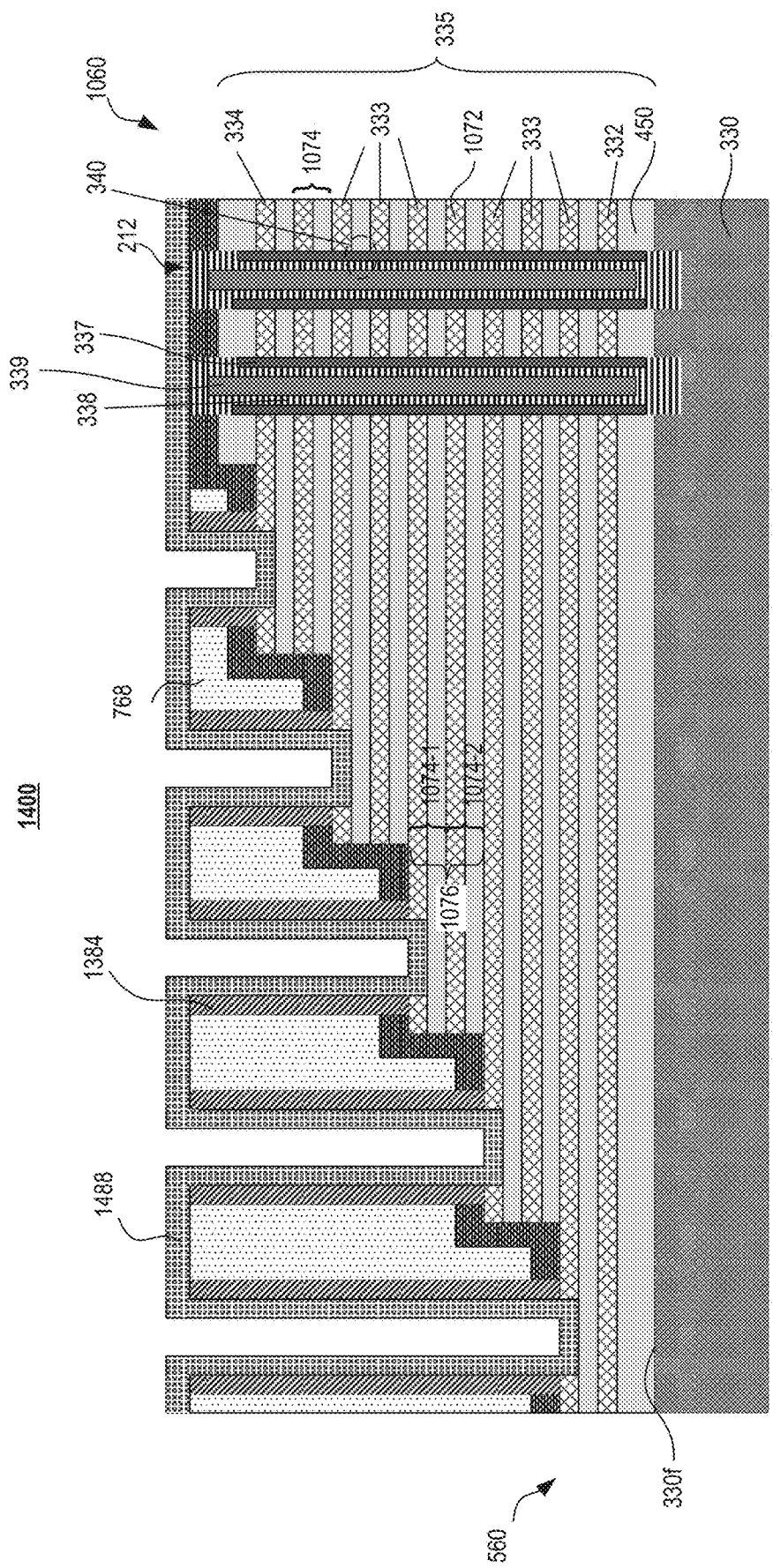

FIG. 14 illustrates a cross-sectional view of an exemplary structure 1400 of a three dimensional memory device, according to some embodiments, wherein the structure 1400 includes a second insulating layer 1488 disposed over the structure 1300.

The second insulating layer 1488 covers the exposed conductive materials inside the ring openings 1386, e.g., the conductive ring 1384 and sidewalls of the conductive layer 1072 of the upper layer pair 1074-1 for each staircase step 1076. The second insulating layer 1488 can be made of a similar material as the first insulating layer 768 and used a similar deposition technique.

Figure 15:
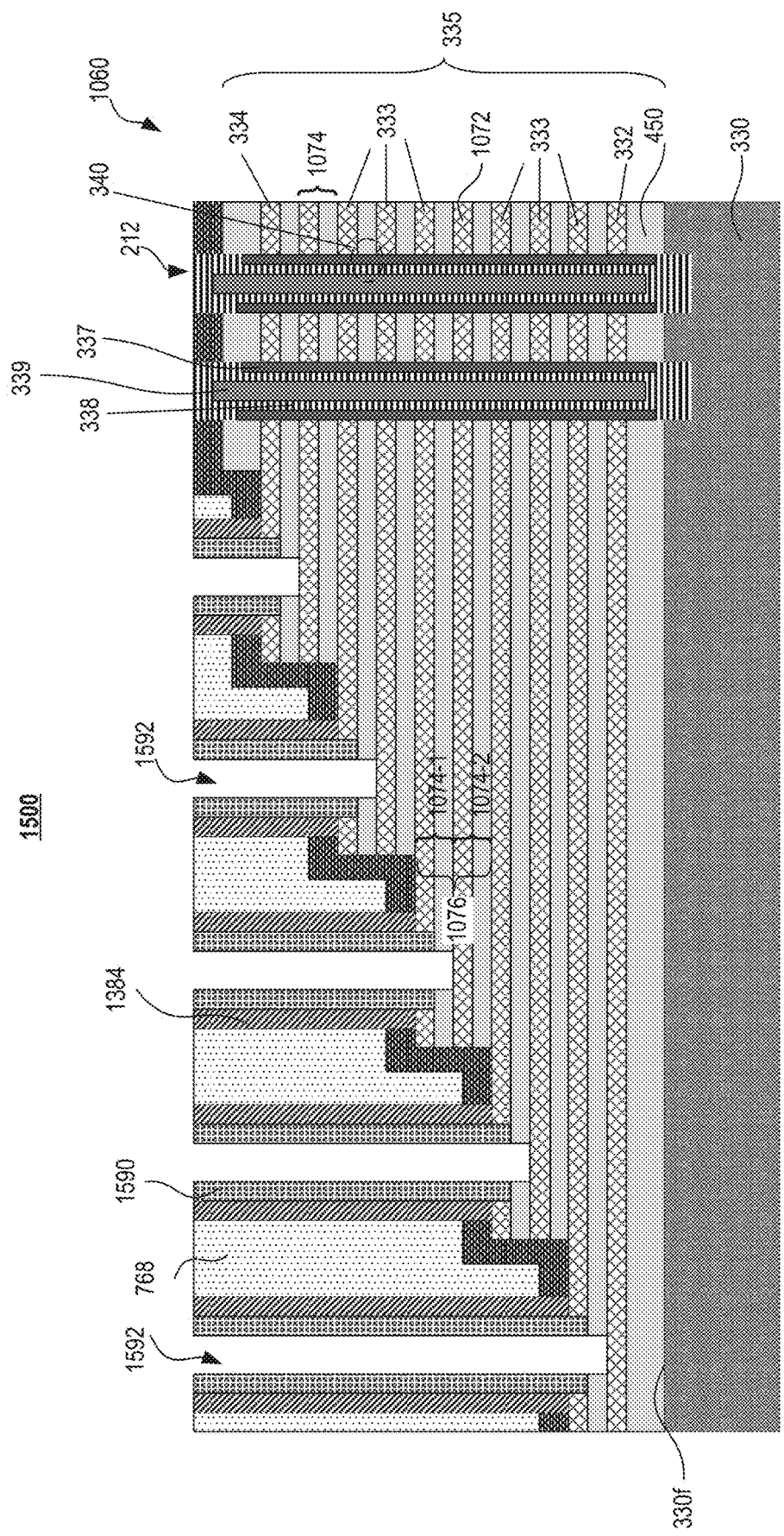

FIG. 15 illustrates a cross-sectional view of an exemplary structure 1500 of a three dimensional memory device, according to some embodiments, wherein the structure 1500 includes a plurality of insulating rings 1590 and a plurality of second contact holes 1592. The insulating rings 1590 can be formed by etching portions of the second insulating layer 1488 and the dielectric layer 450 from the bottom of the ring openings 1386 on structure 1400 (in FIG. 14), wherein the layer 1488 and 450 can be etched using an anisotropic etching, similar to the technique used for forming the conductive ring 1384 except using a different etchant for the dielectric material. In some embodiments, the second insulating layer 1488 can be silicon oxide. In this example, the etching of silicon oxide can include RIE using fluorine based gases, for example, carbon-fluorine ($CF_4$), hexafluoroethane ($C_2F_6$), $CHF_3$, or $C_3F_6$ and/or any other suitable gases.

The second contact hole 1592 extends through the second insulating layer 1488 and the dielectric layer 450 of the upper layer pair 1074-1 for each staircase step 1076, exposing the conductive layer 1072 of the lower layer pair 1074-2.

FIG. 16A illustrates a cross-sectional view of an exemplary structure 1600 of a three dimensional memory device, according to some embodiments, wherein the structure 1600 includes a plurality of conductive cores 1694.

The conductive core 1694 can be made of any suitable conductive materials and can be similar to the conductive film 1282, forming by a similar technique. The conductive material for the conductive core 1694 can be disposed over the structure 1500, filling the second contact hole 1592. The conductive core 1694 directly contacts with the conductive layer 1072 of the lower layer pair 1074-2 of each staircase step 1076.

In some embodiments, a planarization process, such as CMP, can be used to remove any conductive materials on the top surface 768S of the first insulating layer 768.

FIG. 16B illustrates a perspective view of the structures 1600, wherein the insulating and dielectric layers are omitted for clarity. The conductive ring 1384 and the conductive core 1694 form a coaxial contact structure 1696 on the staircase structure 1060. In some embodiments, the staircase step 1076 of the staircase structure 1060 includes two conductive and dielectric layer pairs, the upper layer pair 1074-1 and the lower layer pair 1074-2. The conductive ring 1384 can be electrically connected to the conductive layer 1072 of the upper layer pair 1074-1 of the staircase step 1076. The conductive core 1694 can be electrically connected to the conductive layer 1072 of the lower layer pair 1074-2 of the staircase step 1076. The conductive ring 1384 and the insulating ring 1590 form a conductive and insulating ring pair 1697, corresponding to one of the conductive and dielectric layer pairs of the staircase step 1076.

FIG. 17A-17D shows another embodiment of the contact structures for the gate electrodes of a three dimensional memory device. In FIG. 17A-17D a portion of the contact structure and staircase structure are illustrated as an example. Similar elements are labeled with the same reference numbers to compare with the corresponding elements in FIG. 13-16A.

In this example, during the formation of the conductive ring 1384, using similar processes as described in FIG. 13, the etching process can be performed longer to form a first contact hole 1786, wherein the first contact hole 1786 can extend further through the dielectric layer 450 of the upper layer pair 1074-1 in the staircase step 1076, exposing the conductive layer 1072 of the lower layer pair 1074-2 (see structure 1710 in FIG. 17A).

FIG. 17B shows a cross-sectional view of an exemplary structure 1720 of a three dimensional memory device, according to some embodiments, wherein the structure 1720 includes the second insulating layer 1488 disposed over the structure 1710 on the conductive ring 1384, a sidewall of the dielectric layer 450 and the exposed portion of the conductive layer 1072 of the lower layer pair 1074-2 of the staircase step 1076.

FIG. 17C shows a cross-sectional view of an exemplary structure 1730 of a three dimensional memory device, according to some embodiments, wherein the structure 1730 includes an insulating spacer 1790 and a contact hole 1792, wherein the contact hole 1792 extends through the second insulating layer 1488 at the bottom, exposing the conductive layer 1072 of the lower layer pair 1074-2 of the staircase step 1076.

FIG. 17D shows a cross-sectional view of an exemplary structure 1740 of a three dimensional memory device, according to some embodiments, wherein the structure 1740 includes a conductive core 1794, wherein the conductive core 1974 can be made from a similar material as the conductive core 1694 and formed by a similar technique. In this example, a coaxial contact structure 1796, similar to the coaxial contact structures 1696 is formed.

Through the coaxial contact structures 1696/1796, the electrical conductive path for the gate electrode of each memory cell can be wired up to the surface of the wafer, enabling various configurations of word lines and select gates for the 3D memory in the back-of-line process.

After forming structure 1600/1740, fabrication of 3D memory device can be resumed with back-end-of-line (BEOL) metal interconnects, and are known to a person with ordinary skill in the art. In some embodiments, a second session of word line stack can be added to the structure 1600/1740 to further increase the vertical number of memory cells.

In some embodiments, the staircase structure 1060 can include a plurality of staircase steps 1076, each staircase step 1076 having N number of conductive and dielectric layer pairs 1697, wherein N is a whole number no less than two. In this example, there can be N−1 number of conductive and insulating ring pairs 1697 in addition to a conductive core 1694. Each conductive and insulating ring pair 1697 includes one conductive ring 1384 and one insulating ring 1590, wherein the insulating ring 1590 is disposed to surround a sidewall of the conductive ring 1384 and is configured to electrically isolate the conductive ring 1384 from another conductive ring 1384 or the conductive core 1694. The conductive core 1694 is located in the center of the coaxial contact structure 1696. In some embodiments, the conductive core 1694 can also include an insulating core that fills possible seams or holes in the conductive core 1694.

The conductive core 1694 and the conductive rings 1384 can be arranged so that the conductive rings 1384 make electrical contact with the conductive layer 1072 of a corresponding conductive and dielectric layer pair 1697 of the staircase step 1076. An outer conductive ring with a larger diameter can connect to the conductive layer 1072 of an upper conductive and dielectric layer pair of the staircase step 1076. An inner conductive ring with a smaller diameter can connect to the conductive layer 1072 of a lower conductive and dielectric layer pair of the staircase step 1076. The upper conductive and dielectric layer pair is farther away from the substrate, whereas the lower conductive and dielectric layer pair is closer to the substrate. The conductive core 1694 can connect to the bottommost conductive layer, e.g., the pair closest to the substrate, within the staircase step 1076 of N number of conductive and dielectric layer pairs.

In some embodiments, the conductive rings 1384 extend through the first insulating layer 768 to contact the conductive layer 1072 of the staircase structure 1060. In some embodiments, the conductive rings 1384 also extend through the barrier layer 664 to contact the conductive layer 1072 of the staircase structure 1060. In some embodiments, a gate dielectric layer can be disposed on the conductive layer 1072. In this example, the conductive rings 1384 extend further through the gate dielectric layer to contact the conductive layer of the staircase structure 1060.

In some embodiments, the insulating ring 1590 of the conductive and insulating ring pair 1697 can be disposed to surround a sidewall of the conductive layer of the staircase structure in addition to the sidewall of the conductive ring. In some embodiments, the insulating ring can be disposed on a sidewall of the dielectric layer of the staircase step of N number of conductive and dielectric layer pairs (similar to the structure shown in FIG. 17D).

By using the coaxial contact structure to connect two or more conductive layers of the staircase structure, the number of staircase steps can be reduced and thereby the overall lateral dimension of the staircase structure can be reduced. Accordingly the area of staircase region 210 (shown in FIG. 2A) can be greatly reduced, and higher density memory storage can be achieved.

Figure 18:
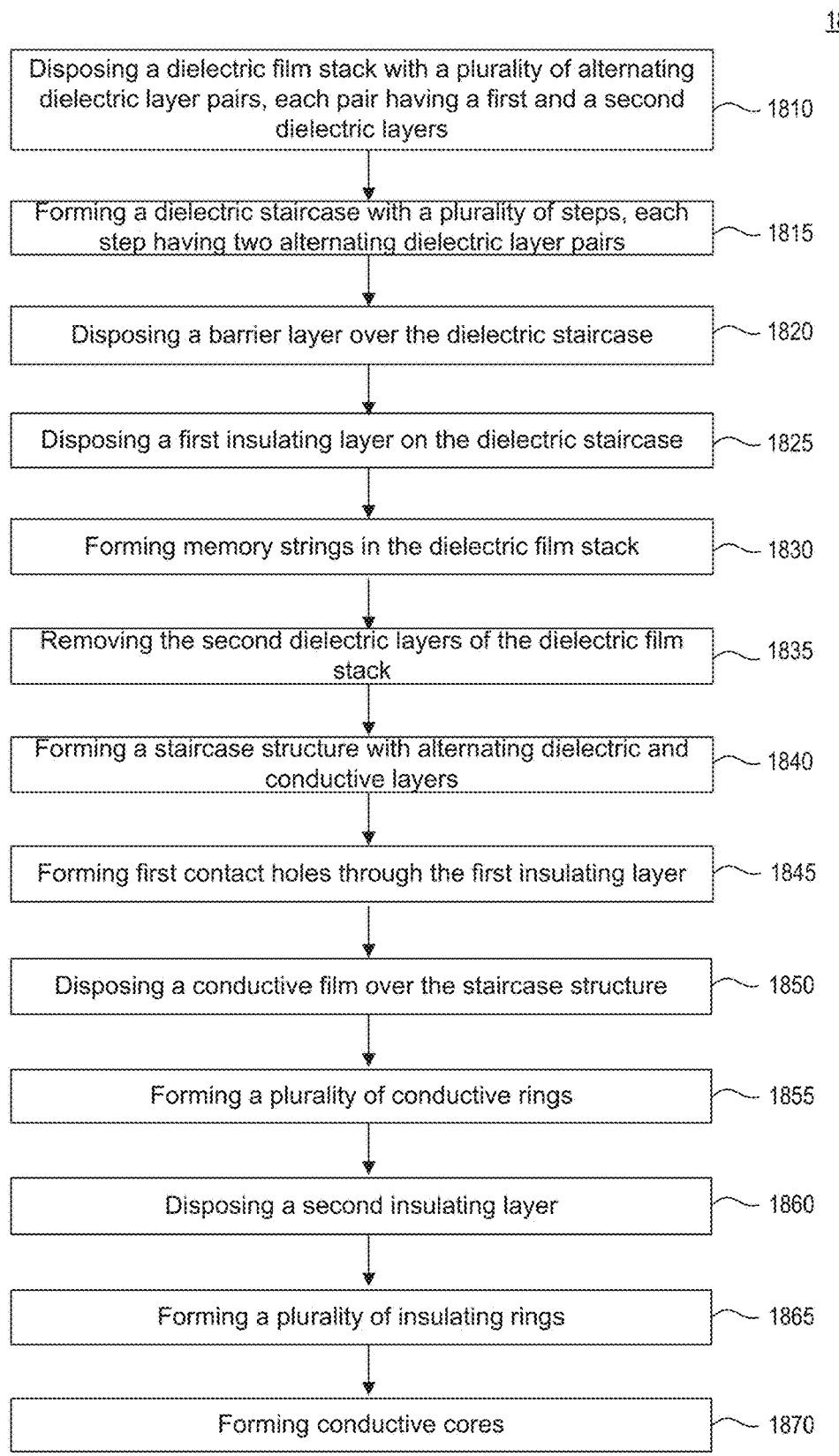
FIG. 18 illustrates a flow diagram of an exemplary method for forming a 3D memory structure, according to some embodiments of the present disclosure.

FIG. 18 illustrates an exemplary method 1800 for forming staircase and contact structures for a three-dimensional memory array, according to some embodiments. The process steps of the method 1800 can be used to form memory device structures illustrated in FIGS. 4-16A. The process steps shown in method 1800 are not exhaustive and other process steps can be performed as well before, after, or between any of the illustrated process steps. In some embodiments, some process steps of exemplary method 1800 can be omitted or include other process steps that are not described here for simplicity. In some embodiments, process steps of method 1800 can be performed in a different order and/or vary.

At process step 1810, a dielectric film stack is disposed on a substrate. The dielectric film stack can be the dielectric film stack 445 in FIG. 4, with alternating dielectric (first dielectric) and sacrificial (second dielectric) layers. The dielectric and sacrificial layers are similar to the dielectric layer 450 and the sacrificial layer 452 in FIG. 4 and can be disposed using a similar technique. The dielectric layer and the sacrificial layer below are called an alternating dielectric layer pair.

At process step 1815, a dielectric staircase is formed in the dielectric film stack. An example of the dielectric staircase is shown as the dielectric staircase 560 in FIG. 5, wherein the dielectric staircase includes a plurality of staircase layers, e.g., staircase steps. Each staircase step includes two or more alternating dielectric layer pairs. As an example, FIG. 5 depicts a dielectric staircase with two alternating dielectric layer pairs. The plural steps of the dielectric staircase can be formed by applying a repetitive etch-trim process on the dielectric film stack. First, a patterning mask is disposed and patterned on the dielectric film stack. Then, portions of the dielectric film stack can be exposed and etched in a direction perpendicular to a main surface of the substrate until portions of the two dielectric layer pairs are removed. Afterwards, the patterning mask is trimmed laterally, in a direction parallel to the main surface of the substrate. The etching and trimming processes can be repeated until a dielectric staircase step closest to the main surface of the substrate is formed. Finally, the patterning mask can be removed.

At process step 1820, a barrier layer is disposed over the dielectric staircase, wherein the barrier layer can be the barrier layer 664 in FIG. 6 and can be made of a similar material and formed using a similar technique.

At process step 1825, a first insulating layer is disposed over the dielectric staircase. In some embodiments, the first insulating layer is disposed on the barrier layer. The first insulating layer can be the first insulating layer 768 in FIG. 7. Next, a planarization process, such as chemical mechanical polishing (CMP) or reaction-ion-etching, can be performed to form a coplanar surface. An example of the structure is shown in FIG. 7.

At process step 1830, a plurality of memory strings are formed in the dielectric film stack with alternating dielectric layer pairs. The memory string is similar to the memory string 212 in FIG. 8, and includes a memory film, a channel layer and a core filling film.

At process step 1835, the dielectric film stack of alternating dielectric layer pairs is patterned to form a plurality of slit openings. The slit openings extend horizontally along the dielectric staircase and extend vertically through the dielectric film stack. Next, the sacrificial layers of the dielectric staircase are removed horizontally from the slit openings to form a plurality of horizontal tunnels in the staircase structure. After removing the sacrificial layers, the memory film of the memory strings are exposed inside the plurality of tunnels. FIG. 9 shows an example of the structure after removing the sacrificial layers.

At process step 1840, conductive materials are disposed inside the horizontal tunnels, forming a staircase structure with alternating conductive and dielectric layers, which is similar to the staircase structure 1060 in FIG. 10. The conductive layer can be made of a similar material as the conductive layer 1072 and can be disposed using a similar technique. In some embodiments, a gate dielectric layer can be disposed on sidewalls of the horizontal tunnels prior to the conductive layer deposition, wherein the gate dielectric layer includes high-k dielectric material, silicon oxide, silicon nitride or silicon oxynitride. After replacing the sacrificial layer with the conductive layer, the staircase structure include a plurality of staircase steps, each having two conductive and dielectric layer pairs, e.g., upper layer pair and lower layer pair.

At process step 1845, the first insulating layer is patterned, forming a plurality of first contact holes. The first contact holes extend through the first insulating layer and the optional barrier layer and expose the conductive layer of upper layer pair of the staircase step. The first contact holes 1180 in FIG. 11 is an example of the plurality of first contact holes.

At process step 1850, a conductive film is disposed over the staircase structure. The conductive film is disposed on the exposed portion of the conductive layer of the staircase structure and also on a sidewall of the first contact hole. The conductive film can be the conductive film 1282 in FIG. 12, and can be disposed using a similar technique.

At process step 1855, the conductive film at the bottom of the first contact holes is removed through anisotropic etching, forming conductive rings along a sidewall of the first insulating layer. Examples of the conductive rings are shown in FIG. 13 as the conductive rings 1384. The conductive rings can be made of a similar material as the conductive rings 1384 and be formed using a similar technique.

At process step 1860, a second insulating layer is disposed over the staircase structure on the conductive rings. The second insulating layer is similar to the second insulating layer 1488 in FIG. 14 and can be made of a similar material using a similar technique.

At process step 1865, a plurality of insulating rings are formed by anisotropic etching of the second insulating layer. The insulating ring surrounds a sidewall of the conductive ring as well as an exposed portion of the conductive layer of the upper layer pair in the staircase step. During the etching process, the dielectric layer of the upper layer pair can also be removed and the conductive layer of the lower layer pair can be exposed. A plurality of second contact holes are formed accordingly. An example of the insulating rings and second contact holes is shown in FIG. 15, as the insulating rings 1590 and the second contact hole 1592.

At process step 1870, a plurality of conductive cores are formed inside the second contact holes. The conductive core contact the conductive layer of the lower layer pair in the staircase step. The conductive core can be the conductive core 1694 in FIG. 16, and can be formed using a similar technique. A planarization process, for example CMP, can be used to form a coplanar surface. From top down, the conductive ring, insulating ring and the conductive core form a coaxial contact structure. The coaxial contact structures can provide electrical connections to each of the conductive layer of the staircase structure. With two conductive and dielectric layer pairs per staircase step, the number of contact structures can be reduced to half, saving the area of staircase region. From these coaxial contact structures, back-end-of-line processes can be resumed with metal interconnect lines to form a functional 3D NAND memory.

In some embodiments, the staircase structure 1060 can include a plurality of staircase steps 1076, each staircase step 1076 having N number of conductive and dielectric layer pairs 1697, wherein N is a whole number no less than two. In this example, there can be N-1 number of conductive and insulating ring pairs 1697 in addition to a conductive core 1694. N-1 number of conductive and insulating ring pairs and the conductive core can be formed using similar processes as described in process steps 1845-1870.

In some embodiments, to form the N-1 number of conductive and insulating ring pairs, a first contact hole can be formed to expose a conductive layer in one of the N number of conductive and dielectric layer pairs of the staircase step in the staircase structure. Then a conductive film can be disposed on a sidewall of the contact hole and the exposed conductive layer. Next, the conducive film and a portion of the conductive layer from the bottom of the first contact hole can be removed to form a conductive ring, wherein a bottom of the conductive ring is formed to contact the conductive layer in one of the N number of conductive and dielectric layer pairs of the staircase step in the staircase structure. In some embodiments, the dielectric layer of the next conductive and dielectric layer pair can also be removed during the etching process for the conductive ring.

In some embodiments, a second insulating layer can be disposed in the first contact hole and the second insulating layer can then be removed from the bottom of the first contact hole to form an insulating ring, thereby surrounding a sidewall of the conductive ring and a sidewall of the conductive layer is exposed in the first contact hole. The cyclic processes for the next conductive and insulating ring pairs resume, starting by forming a second contact hole to expose the next conductive layer in the staircase step, etc.

In some embodiments, the conductive core of the coaxial contact structure can be formed last. After forming a contact hole to expose the bottommost conductive layer, e.g., closest to the substrate, in the staircase step of N number of conductive and dielectric layer pairs, a conductive material can be disposed to fill the contact hole, and a conductive core can be formed to contact the bottommost conductive layer using a planarization process, such as chemical mechanical polishing. The conductive material outside the contact hole can be removed and the structure can be formed with a coplanar surface.

Accordingly, a staircase structure is formed with a plurality of staircase steps, each step having N number of conductive layers. A plurality of coaxial contact structures are formed on the staircase structure. Each coaxial contact structure can provide N number of conductive paths to connect to the N number of the conductive layers, and to the word lines for the vertically stacked memory strings. By sharing contact structures, the lateral dimension of the staircase structure can be greatly reduced, the storage density of the 3D memory devices can be increased.

Various embodiments in accordance with the present disclosure provide a 3D memory device with smaller die size, higher device density, and improved performance compared with other 3D memory devices.

Accordingly, various embodiments of three-dimensional memory device and methods of making the same are described in the present disclosure.

In some embodiments, the three-dimensional memory structure includes a film stack disposed on a substrate, wherein the film stack includes a plurality of conductive and dielectric layer pairs, each conductive and dielectric layer pair having a conductive layer and a first dielectric layer. The three-dimensional memory structure also includes a staircase structure formed in the film stack, wherein the staircase structure includes a plurality of steps, each staircase step having two or more conductive and dielectric layer pairs. The three-dimensional memory structure further includes a plurality of coaxial contact structures formed in a first insulating layer over the staircase structure, wherein each coaxial contact structure includes one or more conductive and insulating ring pairs and a conductive core, wherein each conductive and insulating ring pair includes a conductive ring and an insulating ring.

In some embodiments, a method for forming a three-dimensional memory structure includes disposing a dielectric film stack on a substrate, wherein the dielectric film stack includes a plurality of alternating dielectric layer pairs, each alternating dielectric layer pair having a first dielectric layer and a second dielectric layer different from the first dielectric layer. The method also includes forming a dielectric staircase in the dielectric film stack, wherein the dielectric staircase includes a plurality of steps, each dielectric staircase step having two or more alternating dielectric layer pairs. The method further includes disposing a first insulating layer on the dielectric staircase, forming a plurality of memory strings in the dielectric film stack, and replacing the second dielectric layers with conductive layers to form a staircase structure with a plurality of steps, wherein each staircase step includes two or more conductive and dielectric layer pairs, each conductive and dielectric layer pair having a conductive layer and the first dielectric layer. The method also includes forming a plurality of coaxial contact structures on the staircase structure.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
   a film stack, comprising a dielectric layer and a conductive layer alternatingly stacked in a first direction;
   a staircase structure disposed in the film stack and comprising a staircase step, wherein the staircase step comprises two or more alternatingly stacked dielectric layers and conductive layers;
   a barrier layer and a first insulating layer disposed on the staircase structure; and
   a coaxial contact structure disposed on the staircase step and extending through the first insulating layer and the barrier layer in the first direction, wherein:
   the coaxial contact structure comprises a conductive ring, an insulating ring and a conductive core, wherein the insulating ring is disposed between the conductive ring and the conductive core;
   a bottom surface of the conductive core contacts a lowermost conductive layer of the staircase step;
   a bottom surface of the conductive ring contacts an upper conductive layer stacked above the lowermost conductive layer; and
   a bottom surface of the insulating ring contacts a corresponding dielectric layer disposed between the lowermost conductive layer and the upper conductive layer of the staircase step.

2. The memory device of claim 1, wherein the conductive core is in a center of the coaxial contact structure and comprises a diameter smaller that a diameter of the conductive ring.

3. The memory device of claim 1, wherein in the first direction a length of the conductive core is longer than a length of the conductive ring.

4. The memory device of claim 1, wherein the insulating ring covers an outer sidewall of the conductive core and an inner sidewall of the conductive ring.

5. The memory device of claim 4, wherein at least a portion of a sidewall of the insulating ring contacts a sidewall of the upper conductive layer.

6. The memory device of claim 1, wherein in the first direction a length of the conductive core is longer than a length of the insulating ring.

7. The memory device of claim 1, wherein at least a portion of a sidewall of the conductive ring contacts a sidewall of the barrier layer.

8. The memory device of claim 1, further comprising memory strings extending through the film stack in the first direction.

9. The memory device of claim 1, wherein the coaxial contact structure is coplanar with the first insulating layer at an end further way from the staircase step.

10. A memory device, comprising:
    a staircase step comprising alternatingly stacked dielectric layers and conductive layers;
    a barrier layer disposed on the staircase step and covering a sidewall and a top surface of the staircase step;
    a first insulating layer disposed on the barrier layer;
    a coaxial contact structure extending through the first insulating layer and the barrier layer and configured to provide electrical connections for the conductive layers of the staircase step, wherein:
    the coaxial contact structure comprises an outer conductive ring, an insulating ring and an inner conductive ring, wherein the insulating ring is disposed between the outer conductive ring and the inner conductive ring;
    a bottom surface of the outer conductive ring and a bottom surface of the inner conductive ring contact an upper conductive layer and a lower conductive layer of the staircase step, respectively; and
    a bottom surface of the insulating ring contacts a corresponding dielectric layer disposed between the upper conductive layer and the lower conductive layer of the staircase step.

11. The memory device of claim 10, wherein a diameter of the outer conductive ring is larger than a diameter of the inner conductive ring.

12. The memory device of claim 10, wherein a length of the outer conductive ring is shorter than a length of the inner conductive ring.

13. The memory device of claim 10, wherein the insulating ring is configured to isolate the outer conductive ring and the inner conductive ring.

14. The memory device of claim 13, wherein at least a portion of a sidewall of the insulating ring contacts a sidewall of the upper conductive layer.

* * * * *